US008026113B2

(12) United States Patent
Kaushal et al.

(10) Patent No.: US 8,026,113 B2
(45) Date of Patent: Sep. 27, 2011

(54) METHOD OF MONITORING A SEMICONDUCTOR PROCESSING SYSTEM USING A WIRELESS SENSOR NETWORK

(75) Inventors: Sanjeev Kaushal, Austin, TX (US); Kenji Sugishima, Tokyo (JP); Donthineni Ramesh Kumar Rao, Redwood City, CA (US)

(73) Assignee: Tokyo Electron Limited, Tokyo (JP)

( * ) Notice: Subject to any disclaimer, the term of this patent is extended or adjusted under 35 U.S.C. 154(b) by 284 days.

(21) Appl. No.: 11/277,448

(22) Filed: Mar. 24, 2006

(65) Prior Publication Data

US 2007/0224712 A1   Sep. 27, 2007

(51) Int. Cl.
*H01L 21/66* (2006.01)
*G01R 31/26* (2006.01)

(52) U.S. Cl. .......... 438/14; 702/176; 702/182; 702/183; 702/184; 702/185; 257/E21.521; 257/E21.522; 257/E21.525; 257/E21.529

(58) Field of Classification Search ...................... 438/14
See application file for complete search history.

(56) References Cited

U.S. PATENT DOCUMENTS

| | | | | |
|---|---|---|---|---|
| 4,967,337 A * | 10/1990 | English et al. | ................. | 700/79 |
| 5,360,980 A * | 11/1994 | Borden et al. | ................. | 250/573 |
| 5,444,637 A * | 8/1995 | Smesny et al. | ................. | 702/127 |
| 5,676,132 A * | 10/1997 | Tillotson et al. | ......... | 128/204.23 |
| 5,827,959 A * | 10/1998 | Clanin | ............................ | 73/198 |
| 5,902,403 A * | 5/1999 | Aitani et al. | .................. | 118/715 |
| 5,910,011 A * | 6/1999 | Cruse | .............................. | 438/16 |
| 6,195,621 B1 | 2/2001 | Bottomfield | | |
| 6,227,035 B1 * | 5/2001 | Rice et al. | ...................... | 73/37.9 |
| 6,343,617 B1 * | 2/2002 | Tinsley et al. | ................. | 137/486 |
| 6,351,723 B1 * | 2/2002 | Maekawa | ....................... | 702/185 |
| 6,559,942 B2 * | 5/2003 | Sui et al. | ........................ | 356/369 |
| 6,605,134 B2 * | 8/2003 | Ishihara et al. | ................... | 95/45 |

(Continued)

FOREIGN PATENT DOCUMENTS

JP    09228052 A    9/1997

(Continued)

OTHER PUBLICATIONS

European Patent Office, International Search Report and Written Opinion received in corresponding PCT Application No. PCT/US2007/063466, dated Sep. 14, 2007, 11 pgs.

(Continued)

*Primary Examiner* — Charles Garber
*Assistant Examiner* — Pape Sene
(74) *Attorney, Agent, or Firm* — Wood, Herron & Evans, LLP

(57) ABSTRACT

A method and system for non-invasive sensing and monitoring of a processing system employed in semiconductor manufacturing. The method allows for detecting and diagnosing drift and failures in the processing system and taking the appropriate correcting measures. The method includes positioning at least one non-invasive sensor on an outer surface of a system component of the processing system, where the at least one invasive sensor forms a wireless sensor network, acquiring a sensor signal from the at least one non-invasive sensor, where the sensor signal tracks a gradual or abrupt change in a processing state of the system component during flow of a process gas in contact with the system component, and extracting the sensor signal from the wireless sensor network to store and process the sensor signal. In one embodiment, the non-invasive sensor can be an accelerometer sensor and the wireless sensor network can be motes-based.

35 Claims, 13 Drawing Sheets

U.S. PATENT DOCUMENTS

| | | | |
|---|---|---|---|
| 6,782,348 B2 * | 8/2004 | Ushiku | 702/183 |
| 6,803,548 B2 | 10/2004 | Wang et al. | |
| 6,898,558 B2 * | 5/2005 | Klekotka | 702/188 |
| 6,905,895 B1 * | 6/2005 | Coss et al. | 438/16 |
| 6,916,396 B2 * | 7/2005 | Kagoshima et al. | 156/345.24 |
| 6,942,891 B2 * | 9/2005 | Komiyama et al. | 427/8 |
| 6,947,803 B1 | 9/2005 | Bode et al. | |
| 7,020,583 B2 * | 3/2006 | Calabrese et al. | 702/187 |
| 7,127,358 B2 * | 10/2006 | Yue et al. | 702/30 |
| 7,212,953 B1 * | 5/2007 | Artiuch | 702/183 |
| 7,253,107 B2 * | 8/2007 | Snijders | 438/680 |
| 7,395,131 B2 * | 7/2008 | Funk | 700/108 |
| 2001/0044161 A1 * | 11/2001 | Komiyama | 438/14 |
| 2002/0022283 A1 * | 2/2002 | Bernard et al. | 438/14 |
| 2002/0148307 A1 | 10/2002 | Jonkers | |
| 2002/0198668 A1 * | 12/2002 | Lull et al. | 702/45 |
| 2003/0045011 A1 * | 3/2003 | Sandhu et al. | 438/14 |
| 2003/0230551 A1 * | 12/2003 | Kagoshima et al. | 216/72 |
| 2004/0060659 A1 * | 4/2004 | Morioka et al. | 156/345.26 |
| 2004/0127031 A1 | 7/2004 | Klekotka | |
| 2004/0153127 A1 | 8/2004 | Gordon et al. | |
| 2004/0226390 A1 * | 11/2004 | Beginski | 73/865.9 |
| 2005/0071036 A1 * | 3/2005 | Mitrovic | 700/121 |
| 2005/0092089 A1 | 5/2005 | Gilgunn | |
| 2005/0095859 A1 * | 5/2005 | Chen et al. | 438/689 |
| 2005/0096776 A1 | 5/2005 | Beaulieu et al. | |
| 2005/0098906 A1 * | 5/2005 | Satoh et al. | 261/19 |
| 2005/0120805 A1 * | 6/2005 | Lane et al. | 73/861 |
| 2005/0145333 A1 * | 7/2005 | Kannan et al. | 156/345.24 |
| 2005/0145614 A1 | 7/2005 | Wu et al. | |
| 2005/0201567 A1 * | 9/2005 | Browne et al. | 381/71.5 |
| 2005/0246124 A1 * | 11/2005 | Tomer et al. | 702/117 |
| 2005/0252884 A1 * | 11/2005 | Lam et al. | 216/59 |
| 2005/0279454 A1 * | 12/2005 | Snijders | 156/345.29 |
| 2006/0015294 A1 * | 1/2006 | Yetter et al. | 702/183 |
| 2006/0100824 A1 * | 5/2006 | Moriya | 702/183 |

FOREIGN PATENT DOCUMENTS

| | | |
|---|---|---|
| JP | 2000031135 A | 1/2000 |
| JP | 2004014902 A | 1/2004 |

OTHER PUBLICATIONS

European Patent Office, Invitation to Pay Additional Fees with Partial Search Report received in related PCT Application No. PCT/US2007/063462, dated Aug. 31, 2007, 4 pp.

European Patent Office, International Search Report and Written Opinion received in related PCT Application No. PCT/US2007/063462, dated Nov. 16, 2007, 14 pp.

U.S. Patent and Trademark Office, Office Action received in related U.S. Appl. No. 11/277,467, dated Dec. 14, 2007, 23 pp.

U.S. Patent and Trademark Office, Office Action received in related U.S. Appl. No. 11/277,467, dated Aug. 7, 2008, 22 pp.

* cited by examiner

METHOD OF MONITORING A SEMICONDUCTOR PROCESSING SYSTEM USING A WIRELESS SENSOR NETWORK

CROSS REFERENCE TO RELATED APPLICATION

This application is related to co-pending U.S. patent application Ser. No. 11/277,467, filed on even date herewith and entitled "Semiconductor Processing System With a Wireless Sensor Network Monitoring System Incorporated Therewith," the disclosure of which is incorporated herein by reference in its entirety as if completely set forth herein below.

FIELD OF THE INVENTION

Embodiments of the invention relate generally to a monitoring system and method for non-invasive sensing and monitoring of a processing system employed in semiconductor manufacturing. The method and system allow for detecting and diagnosing drift and failures in the processing system and taking the appropriate correcting measures.

BACKGROUND OF THE INVENTION

Changes in processing conditions of a processing (manufacturing) system employed in semiconductor manufacturing can lead to significant loss of revenue due to scrap and non-productive system downtime. In this regard, focus has been placed on system software that monitors operation of the manufacturing system and creates alarms when unacceptable process excursions occur or other fault conditions are encountered.

However, what is needed is a method and system to determine the "health" or comprehensive condition of the processing system on an on-going basis or in real time so as to detect emerging fault conditions. In the past, both system manufacturers and device manufacturers have relied on scheduled preventative maintenance (PM) of the processing system or the occurrence of a catastrophic event. However, the method of using scheduled preventive maintenance is simply based on "rules of thumb" derived from average characteristics, such as mean time between failures (MTBF), and does not address detection, diagnosis, or prediction of faulty conditions for individual processing system components or entire processing systems. In addition, this method does not address gradual degradation or drift in the processing conditions of the processing system.

Traditionally, the cost and bulk of sensing technology means that only a handful of hardwired sensors with little flexibility and networking capability could be deployed for most processing systems. The information collected from the few sensors only provides a relatively small amount of data and does not provide desired real-time monitoring and analysis capabilities needed for comprehensive understanding of the processing condition of the processing system.

SUMMARY OF THE INVENTION

Embodiments of the invention provide a monitoring system and a method for non-invasive sensing and monitoring of a processing system employed in semiconductor manufacturing. The method allows for detecting and diagnosing drift and failures in the processing system and taking the appropriate correcting measures.

The method includes positioning a plurality of non-invasive sensors on respective outer surfaces of one or more of a plurality of system components in the semiconductor processing system. The sensors form a wireless sensor network. The method further includes acquiring a sensor signal from the plurality of non-invasive sensors in the wireless sensor network, where the sensor signal tracks a gradual or abrupt change in a processing state of one of the system components during flow of a process gas in the processing system. The sensor signal is then extracted from the wireless sensor network to store and process the sensor signal.

In one embodiment, the non-invasive sensors can be accelerometer sensors and the wireless sensor network can be motes-based.

The semiconductor processing system includes a plurality of system components configured to flow a process gas through the semiconductor processing system, and a wireless sensor network comprising a plurality of non-invasive sensors positioned on respective outer surfaces of one or more of the plurality of system components. The sensors are configured for acquiring a sensor signal tracking a gradual or abrupt change in a processing state of the one or more system components during flow of the process gas through the processing system. The processing system further includes a system controller configured for extracting the sensor signal from the wireless sensor network and storing and processing the sensor signal.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS OF THE INVENTION

Figure 1:
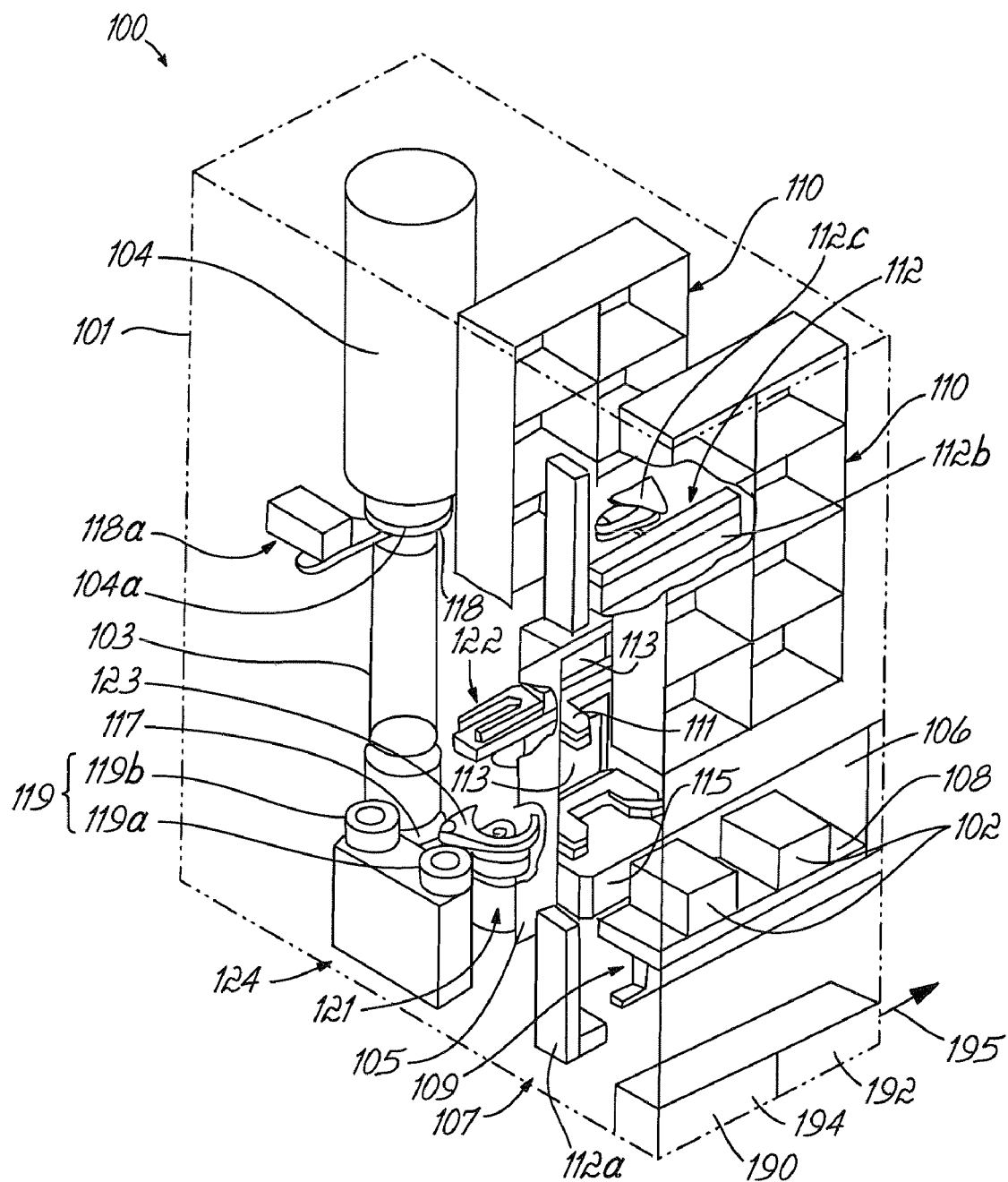
FIG. 1 is an isometric view of a semiconductor thermal processing system in accordance with embodiments of the invention.

Embodiments of the invention provide a network of wireless sensors in industrial automation for preventive maintenance and condition monitoring in semiconductor processing systems. The network of wireless sensors can monitor parameters such as vibration, temperature, and load, and can facilitate proactive, real-time processing system "health" monitoring at the processing system component level and allow for reduced unscheduled maintenance and downtime. Wireless sensors can streamline the costs involved in installing and expanding a condition-based maintenance solution by reducing the costs incurred in using proprietary cables for connecting devices in order to synchronize information. Moreover, wireless networked sensors facilitate improved, comprehensive management of a facility's assets, and wireless sensors can be configured to provide more cost-effective data acquisition and to provide widely disseminated real-time information about semiconductor processing systems and processes over the Internet or intranet.

One embodiment of the invention provides a wireless sensor network platform for monitoring in real-time a processing state of one or more system components of a semiconductor processing system during processing of a substrate for manufacturing of an electronic device. A plurality of wireless sensors are non-invasively mounted on the one or more system components and together form a wireless sensor network. The semiconductor processing system can be any processing system utilized for semiconductor manufacturing that involves gas flow within the system, for example, a thermal processing system, an etching system, a single wafer deposition system, a batch processing system, or a photoresist processing system.

In one embodiment, a processing state of a system component can change due to degradation or drift in a gas flow in contact with the system component due to formation of material deposits inside the system component. Over time, the material deposits can restrict the gas flow through the system component, thereby resulting in a relatively slow degradation or drift in the gas flow without causing an abrupt catastrophic event.

Embodiments of the invention can be applied to one or to a plurality (e.g., two or more) of system components associated with gas flow during a manufacturing process in the semiconductor processing system. By way of example, but not limitation, a system component can be a gas feed line configured for delivering a process gas into a process chamber where one or more substrates (wafers) are processed, a gas exhaust line configured for removing process byproducts from the process chamber, a flow rate adjuster such as a mass flow controller (MFC) configured for controlling the flow rate of the process gas into the process chamber, or an automatic pressure controller such as a variable valve, e.g., a gate valve or a butterfly valve, configured for controlling the gas pressure in the process chamber.

In one embodiment, a method is provided for sensing, monitoring, diagnosing, and predicting degradation or drift conditions in a system component of a semiconductor processing system that may lead to fault conditions if appropriate actions are not taken.

In another embodiment, a method is provided for sensing, monitoring, diagnosing, and predicting degradation or drift conditions in a semiconductor processing system that may lead to misprocessing of one or more substrates if the appropriate actions are not taken.

Embodiments of the invention will now be described with reference to the drawings. FIG. 1 is an isometric view of a semiconductor thermal processing system in accordance with an embodiment of the invention. The thermal processing system 100 contains a housing 101 that forms the outside walls of the thermal processing system when it is configured in a clean room. The interior of the housing 101 is divided by a partition (bulkhead) 105 into a carrier-transferring area 107 into and from which carriers 102 are conveyed and in which the carriers 102 are kept, and a loading area 124 where substrates to be processed (not shown), such as semiconductor wafers W, located in the carriers 102 are transferred to boats 103. The boats 103 are loaded into or unloaded from a vertical type thermal processing furnace (chamber) 104.

As shown in FIG. 1, an entrance 106 is provided in the front of the housing 101 for introducing and discharging the carriers 102 by an operator or an automatic conveying robot (not shown). The entrance 106 is provided with a door (not shown) that can move vertically to open and close the entrance 106. A stage 108 is provided near the entrance 106 in the carrier-transferring area 107 for placing the carriers 102 thereon.

As shown in FIG. 1, a sensor mechanism 109 is provided at the rear portion of the stage 108 for opening a lid (not shown) of a carrier 102 and detecting positions of and the number of semiconductor wafers W in the carrier 102. In addition, there may be shelf-like storing sections 110 above the stage 108 for storing a plurality of the carriers 102.

Two carrier-placing portions (transfer stages) 111 are provided in vertically spaced proportions as tables for placing the carriers 102 thereon for transferring the semiconductor wafers W. Thus, the throughput of the thermal processing system 100 can be improved as one carrier 102 can be exchanged at one carrier-placing portion 111 while the semiconductor wafers are transferred to another carrier 102 at other carrier-placing portion 111.

A carrier transference mechanism 112 is arranged in the carrier-transferring area 107 for transferring the carriers 102 to and from the stage 108, the storing sections 110, and the carrier-placing portions 111. The carrier transference mechanism 112 includes: an elevating arm 112b which can be moved vertically by an elevating mechanism 112a provided on a side of the carrier-transferring area 107, and a transferring arm 112c mounted on the elevating arm 112b for supporting the bottom of the carrier 102 to horizontally transfer the carrier 102.

For example, the carrier 102 can be a closed type, which can house 13 or 25 wafers and which can be hermetically closed by a lid (not shown). The carrier 102 can include a portable plastic container for housing and holding wafers W in multistairs in horizontal attitude and in vertically spaced relation by a prescribed pitch. In one embodiment, the diameter of the wafer W can be 300 mm. Alternately, other wafer sizes may be used. The lid (not shown) is removably attached at the wafer-entrance formed in the front of the carrier 102 in such a manner that the lid can sealingly close the wafer-entrance.

Clean atmospheric air, which has passed through filters (not shown), can be provided into the carrier-transferring area 107, so that the carrier-transferring area 107 is filled with the clean atmospheric air. In addition, clean atmospheric air can also be provided into the loading area 124, so that the loading area 124 is filled with the clean atmospheric air. Alternately, an inert gas, such as nitrogen ($N_2$), is supplied into the loading area 124, so that the loading area 124 is filled with the inert gas.

As shown in FIG. 1, the partition 105 has two openings 113, upper and lower, for transferring a carrier 102. The openings 113 can be aligned with the carrier-placing portions 111. Each opening 113 is provided with a lid (not shown) for opening and closing the opening 113. The opening 113 is formed in such a manner that the size of the opening 113 is substantially the same as that of the wafer-entrance of the carrier 102, so that semiconductor wafers W can be transferred into and from the carrier 102 through the opening 113 and the wafer-entrance.

In addition, a notch aligning mechanism 115 is arranged below the carrier-placing portions 111 and along a vertical central line of the carrier-placing portion 111 for aligning notches (cut portions) provided at peripheries of the semiconductor wafers W, i.e. for aligning the crystalline directions of the semiconductor wafers W. The notch aligning mechanism 115 is adapted to align the notches of the semiconductor wafers W transferred from the carrier 102 on the carrier-placing portion 111 by a transferring mechanism 122.

The notch aligning mechanism 115 has two apparatus in vertically spaced positions, and each apparatus can align the notches of the wafers W. Thus, throughput of the thermal processing system 100 can be improved because one apparatus can transfer back the aligned wafers W to the boat 103 while the other apparatus aligns other wafers W. Each apparatus may be adapted to align plural, for example three or five wafers at a time, such that the time for transferring the wafers W can be substantially reduced.

The thermal processing furnace 104 is disposed in a rear and upper portion in the loading area 124. The thermal processing system furnace 104 has a furnace opening 104a in the bottom thereof. A lid 117 is provided below the furnace 104. The lid 117 is adapted to be vertically moved by an elevating mechanism (not shown) for loading a boat 103 into and unloading it from the furnace 104 and for opening and closing the furnace opening 104a. The boat 103, which can hold a large number of, for example 100 or 150 semiconductor wafers W in vertically spaced multistairs, is adapted to be placed on the lid 117. The boat 103 is made of crystal or the like. The thermal processing furnace 104 is provided with a shutter 118 at the furnace opening 104a for closing the furnace opening 104a while the lid 117 is taken off and the boat 103 is unloaded after the thermal processing. The shutter 118 is adapted to horizontally pivot to open and close the furnace opening 104a. A shutter driving mechanism 118a is provided to make the shutter 118 pivot.

Still referring to FIG. 1, a boat-placing portion (boat stage) 119 is disposed in a side region of the loading area 124 for placing the boat 103 thereon when transferring semiconductor wafers into and from boat 103. The boat-placing portion 119 has a first placing portion 119a and second placing portion 119b arranged between the first placing portion 119a and the lid 117. A ventilating unit (not shown) is disposed adjacent the boat-placing portion 119 for cleaning the circulation gas (the atmospheric air or the inert gas) in the loading area 124 using filters.

A boat-conveying mechanism 121 is arranged between the carrier-placing portion 111 and the thermal processing furnace 104 in the lower portion in the loading area 124 for conveying the boat 103 between the boat-placing portion 119 and the lid 117. Specifically, the boat-conveying mechanism 121 is arranged for conveying the boat 103 between the first placing portion 119a or the second placing portion 119b and the lowered lid 117, and between the first placing portion 119a and the second placing portion 119b.

The transferring mechanism 122 is arranged above the boat-conveying mechanism 121 for transferring semiconductor wafers W between the carrier 102 on the carrier-placing portion 111 and the boat 103 on the boat-placing portion 119, and more specifically, between the carrier 102 on the carrier-placing portion 111 and the notch aligning mechanism 115 and the boat 103 on the first placing portion 119a of the boat-placing portion 119, and between the boat 103 after the thermal processing on the first placing portion 119a and a vacant carrier 102 on the carrier-placing portion 111.

As shown in FIG. 1, the boat-conveying mechanism 121 has an arm 123 which can support one boat 103 vertically and move (expand and contract) horizontally. For example, the boat 103 can be conveyed in a radial direction (a horizontal linear direction) with respect to the rotational axis of the arm 123 by synchronously rotating the arm 123 and a support arm (not shown). Therefore, the area for conveying the boat 103 can be minimized, and the width and the depth of the thermal processing system 100 can be reduced.

The boat-conveying mechanism 121 conveys a boat 103 of unprocessed wafers W from the first placing portion 119a to the second placing portion 119b. Then, the boat-conveying mechanism 121 conveys a boat 103 of unprocessed wafers W onto the lid 117. In this manner, the unprocessed wafers W are prevented from being contaminated by particles or gases coming from the boat 103 of processed wafers W.

When a carrier 102 is placed on the stage 108 through the entrance 106, the sensor mechanism 109 detects the placing state of the carrier 102. Then, the lid of the carrier 102 is opened, and the sensor mechanism 109 detects the positions of and the number of the semiconductor wafers W in the carrier 102. Then the lid of the carrier 102 is closed again, and the carrier 102 is conveyed into a storing section 110 by means of the carrier transfer mechanism 112.

A carrier 102 stored in the storing section 110 is conveyed onto the carrier-placing portion 111 at a suitable time by means of the carrier transference mechanism 112. After the lid of the carrier 102 on the carrier-placing portion 111 and the door of the opening 113 of the partition 105 are opened, the transferring mechanism 122 takes out semiconductor wafers W from the carrier 102. Then, the transferring mechanism 122 transfers them successively into a vacant boat 103 placed on the first placing portion 119a of the boat-placing portion 119 via the notch aligning mechanism 115. While the wafers W are transferred, the boat-conveying mechanism 121 is lowered to evacuate from the transferring mechanism 122, so that the interference of the boat-conveying mechanism 121 and the transferring mechanism 122 is prevented. In this manner, the time for transferring the semiconductor wafers W can be reduced, so that the throughput of the thermal processing system 100 can be substantially improved.

After the transference of the wafers W is completed, the transferring mechanism 122 can move laterally from an opening position to a holding position in the other side region of the housing 101.

After the thermal processing is completed, the lid 117 is lowered, and the boat 103 and the thermally processed wafers are moved out of the furnace 104 into the loading area 124. The shutter 118 hermetically closes the opening 104a of the furnace immediately after the lid 117 has removed the boat 103. This minimizes the heat transfer out of the furnace 104 into the loading area 124, and minimizes the heat transferred to the instruments in the loading area 124.

After the boat 103 containing the processed wafers W is conveyed out of the furnace 104, the boat-conveying mechanism 121 conveys another boat 103 of unprocessed wafers W from the first placing portion 119a to the second placing portion 119b. Then the boat-conveying mechanism 121 conveys the boat 103 of unprocessed wafers W from the second placing portion 119b onto the lid 117. Therefore, the unprocessed semiconductor wafers W in the boat 103 are prevented from being contaminated by particles or gases coming from the boat 103 of processed wafers W when the boat 103 is moved.

After the boat 103 of unprocessed wafers W is conveyed onto the lid 117, the boat 103 and the lid 117 are introduced into the furnace 104 through the opening 104a after the shutter 118 is opened. The boat 103 of unprocessed wafers can then be thermally processed. In addition, after the boat 103 of processed wafers W is conveyed onto the first placing portion 119a, the processed semiconductor wafers W in the boat 103 are transferred back from the boat 103 into the vacant carrier 102 on the carrier-placing portion 111 by means of the transferring mechanism 122. Then, the above cycle is repeated.

Setup, configuration, and/or operation information can be stored by the thermal processing system 100, or obtained from an operator or another system, such as a factory system. Process recipes can be used to specify the action taken for normal processing and the actions taken on exceptional conditions. Configuration screens can be used for defining and maintaining the process recipes. The process recipes can be stored and updated as required. Documentation and help screens can be provided on how to create, define, assign, and maintain the process recipes.

In one embodiment, thermal processing system 100 can include a system controller 190 that can include a processor 192 and a memory 194. Memory 194 can be coupled to processor 192, and can be used for storing information and instructions to be executed by processor 192. Alternately, different controller configurations can be used. In addition, system controller 190 can include a port 195 that can be used to couple thermal processing system 100 to another system (not shown). Furthermore, controller 190 can include input and/or output devices (not shown) for coupling the controller 190 to other elements of the thermal processing system 100. The input and/or output devices can have capabilities for sending and receiving wireless output signals from sensors integrated with the thermal processing system 100.

In addition, the other elements of the thermal processing system 100 can include processors and/or memory (not shown) for executing and/or storing information and instructions to be executed during processing. For example, the memory may be used for storing temporary variables or other intermediate information during the execution of instructions by the various processors in the system. One or more of the system elements can include means for reading data and/or instructions from a computer readable medium. In addition, one or more of the system elements can include means for writing data and/or instructions to a computer readable medium.

Memory devices can include at least one computer readable medium or memory for holding computer-executable instructions and for containing data structures, tables, records, or other data described herein. System controller 190 can use data from computer readable medium memory to generate and/or execute computer executable instructions. The thermal process system 100 can perform a portion or all of the methods of the invention in response to the system controller 190 executing one or more sequences of one or more computer-executable instructions contained in memory. Such instructions may be received from another computer, a computer readable medium, or a network connection.

Stored on any one or on a combination of computer readable media, embodiments of the present invention include software for controlling the thermal processing system 100, for driving a device or devices for implementing embodiments of the invention, and for enabling the thermal processing system 100 to interact with a human user and/or another system, such as a factory system. Such software may include, but is not limited to, device drivers, operating systems, development tools, and application software. Such computer readable media further includes the computer program product of the present invention for performing all or a portion (if processing is distributed) of the processing performed in implementing embodiments of the invention.

In addition, at least one of the elements of the thermal processing system 100 can include a graphic user interface (GUI) component (not shown) and/or a database component (not shown). In alternate embodiments, the GUI component and/or the database component are not required. The user interfaces for the system can be web-enabled, and can provide the system status and alarms status displays. For example, a GUI component (not shown) can provide easy-to-use interfaces that enable users to: view status; create and edit process control charts; view alarm data; configure data collection applications; configure data analysis applications; examine historical data; review current data; generate email-warnings; run multivariate models; and view diagnostics screens.

Figure 2:
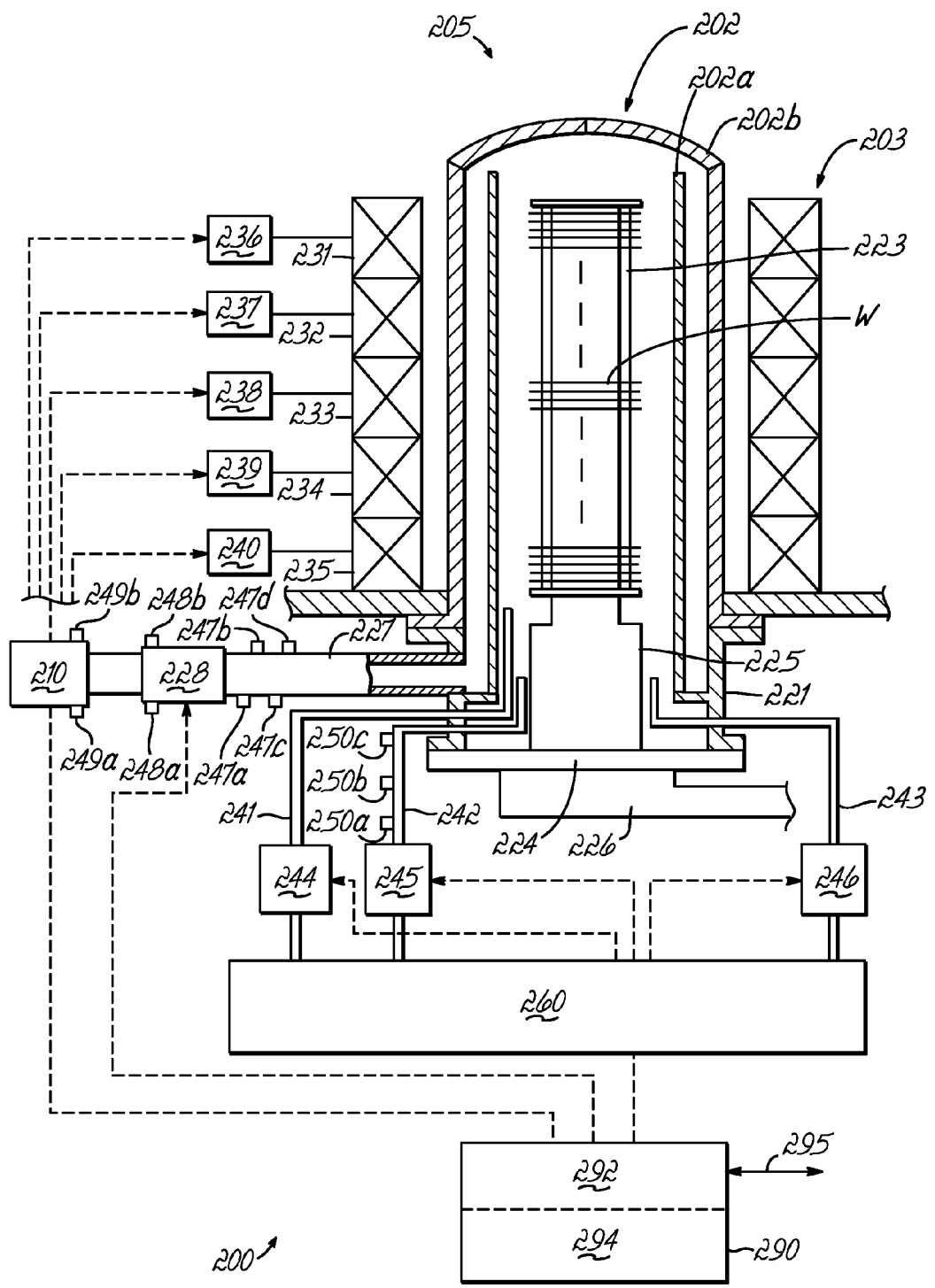
FIG. 2 is a partial cut-away schematic view of a portion of a semiconductor thermal processing system in accordance with embodiments of the invention.

FIG. 2 is partial cut-away schematic view of a portion of a semiconductor thermal processing system 200 in accordance with embodiments of the invention. In the illustrated embodiment, a furnace system 205, an exhaust system 210, a gas supply system 260, and a controller 290 are shown. The furnace system 205 may be the furnace system 104 in thermal processing system 100, and system 100 may include the other components of system 200. The furnace system 205 includes a vertically oriented processing chamber (reaction tube) 202 having a double structure including an inner tube 202a and an outer tube 202b which can, for example, be formed of quartz, and a cylindrical manifold 221 of metal disposed on the bottom of the processing chamber 202. The inner tube 202a is supported by the manifold 221 and has an open top. The outer tube has its lower end sealed air-tight to the upper end of the manifold 221a closed top.

In the processing chamber 202, a number of wafers W (e.g., 150) are mounted on a wafer boat 223 (wafer holder), horizontally one above another at a certain pitch in a shelves-like manner. The wafer boat 223 is held on a lid 224 through a heat insulation cylinder (heat insulator) 225, and the lid 224 is coupled to moving means 226.

The furnace system 205 also includes a heater 203 in the form of, for example, a resistor disposed around the processing chamber 202. The heater 203 can include five stages of heaters 231-235. Alternately, a different heater configuration can be used. The respective heater stages 231-235 are supplied with electric power independently of one another from the associated electric power controllers 236-240. The heater stages 231-235 are supplied with electric power independently of one another from their associated electric power controllers 236-240. The heater stages 231-235 can be used to divide the interior of the processing chamber 202 into five zones.

The gas supply system 260 is shown coupled to the controller 290 and the furnace system 205. The manifold 221 has a plurality of gas feed lines 241-243 for feeding process gases into the inner tube 202a for processing the wafers W. The process gases can be fed to the respective gas feed lines 241, 242, 243 through flow rate adjusters 244, 245, 246, which may be mass flow controllers (MFCs). In an alternate or further embodiment, the system 260 can be a liquid supply system 260. Liquid from the liquid supply system 260 may be vaporized to form a process gas that is flowed through the flow rate adjusters 244, 245, 246.

A gas exhaust line 227 is connected to the manifold 221 for the gas exhaustion through the gap between the inner tube 202a and the outer tube 202b. The gas exhaust line 227 is connected to an exhaust system 210 that contains a vacuum pump. An automatic pressure controller 228 containing a variable position valve, e.g., a gate valve or a butterfly valve, is inserted in the gas exhaust line 227 for automatically controlling a gas pressure in the processing chamber 202.

In the illustrated embodiment in FIG. 2, the semiconductor thermal processing system 200 includes a plurality of non-invasive sensors 247a-247d, 248a-248b, 249a-249b, and 250a-250c for sensing and monitoring a processing state of components of the processing system 200 and the overall processing state of the thermal processing system 200. As used herein, components of the processing systems denote gas lines, including gas feed lines or gas exhaust lines; automatic pressure controllers; mass flow controllers; vacuum pumps; etc. The sensors may be configured to perform continuous, periodic, or triggered sensing. In addition, the sensors may be configured for spacial or temporal sensing. Embodiments of the invention contemplate the use of arrays of identical or different sensors, including sensors that measure light emission/absorption, temperature, vibrations, pressure, humidity, current, voltage, or tilt. Many of the sensors can be easily installed with minimal impact on existing system components of the thermal processing system 200 or, alternately, incorporated during design and construction of the thermal processing system 200.

In one embodiment, a plurality of sensors are positioned on the outer surface of one system component, e.g., sensors 247a-247d on gas exhaust line 227. In another embodiment, one sensor is placed on the outer surface of each of a plurality of system components, e.g., sensors 247a, 248a, 249a, and 250a on exhaust line 227, automatic pressure controller 228, vacuum pump of exhaust system 210 and gas feed line 242, respectively. In yet another embodiment, a plurality of sensors are positioned on the outer surfaces of each of a plurality of system components, such as shown in FIG. 2.

As used herein, a processing state of a component of the processing system 200 may include a real time operating condition of the component relative to a baseline operation condition. In one example, a processing state may be conductance of a gas line that may change due to formation of a material deposit on an inner surface of the gas line. In another example, a processing state of an automatic pressure controller containing a valve may be the time it takes the valve to stabilize its movements in response to a command to increase or decrease pressure in the processing chamber 202. In yet another example, a processing state of an automatic pressure controller containing a valve may be a direction of valve movement (i.e., opening or closing of the valve) or the relative opening or closing of the valve.

According to embodiments of the invention, a plurality of sensors form a wireless sensor network that can significantly improve the ability of semiconductor manufacturers to more efficiently and comprehensively monitor their system components, the entire processing system, and the semiconductor device production process. Wireless sensor networks are particularly beneficial in applications where it is inconvenient, difficult, dangerous, or expensive to deploy wired sensors. Using a network of wireless sensors to monitor such parameters as vibration and/or temperature can facilitate proactive, real-time monitoring of the "health" of the processing system at the system component level and allow for reduced unscheduled maintenance and downtime.

Traditionally, sensor data from system components, such as the gas lines, vacuum pump systems, automatic pressure controllers, and flow rate adjusters, is limited to what is provided by the manufacturers of those system components. In addition, the data rates are fixed and the resolution is not sufficient in characterizing many system level events. According to embodiments of the invention, wireless sensors can streamline the costs involved in installing and expanding a condition-based maintenance solution by reducing the costs incurred in using proprietary cables for connecting devices in order to synchronize information. Moreover, wireless networked sensors facilitate improved, comprehensive management of manufacturing assets, and wireless sensors can be configured to provide more cost-effective data acquisition and to provide widely disseminated real time information about system components or processes over the Internet or an Intranet.

According to one embodiment of the invention, the sensors of the wireless sensor network can include accelerometers. An accelerometer sensor can, for example, be a piezo-electric accelerometer, but other types of accelerometer sensors may be used. A piezo-electric accelerometer produces a charge output when it is compressed, flexed or subjected to shear forces. In a piezo-electric accelerometer, a mass is attached to a piezo-electric crystal, which is in turn mounted to the case of the accelerometer. When the body of the accelerometer is subjected to vibration, the mass mounted on the crystal wants to stay still in space due to inertia and so compresses and stretches the piezo electric crystal. This force causes a charge to be generated, and due to Newton's law ($F=m*a$), this force is in turn proportional to acceleration. The charge output is either converted to a low impedance voltage output by the use of integral electronics or made available as a charge output (units of Pico-coulombs/g) in a charge output piezo-electric accelerometer. Currently, the most common accelerometers available are capacitive microelectromechanical systems based (MEMS-based) accelerometers, characterized by a plate that moves within a capacitor and modulates the capacitance, which is detected as a varying voltage. According to an embodiment of the invention, a MEMS-based sensor can be integrated with a radio, a processor, and memory.

Vibrational signature analysis can be accomplished in the time domain or the frequency domain. Vibrational signature analysis in the time domain may include analysis of patterns, statistical analysis using standard deviation to characterize vibration signal levels, or wavelets for pattern matching. Time-domain vibrational data collected from a sensor may be converted to the frequency domain using a Fourier Transform. Subsequently, the vibration data gathered may be compared to historical or baseline data gathered using the same set of sensors. Hence, repeatability may be more useful than accuracy with respect to calibration standards.

The method of mounting an accelerometer sensor on a system component (e.g., gas feed line 242 or automatic pressure controller 228) affects its frequency response. The mounted natural frequency is dependent directly on the stiffness of the mounting. The higher the stiffness, the more the mounted natural frequency approaches its maximum. For example, a low stiffness mounting of an accelerometer may be obtained using a magnetic mounting and a high stiffness mounting may be obtained using a high tensile setscrew tightened to the correct torque mounted on a hard flat surface. Other mounting methods may be used with intermediate stiffnesses.

Figure 3:
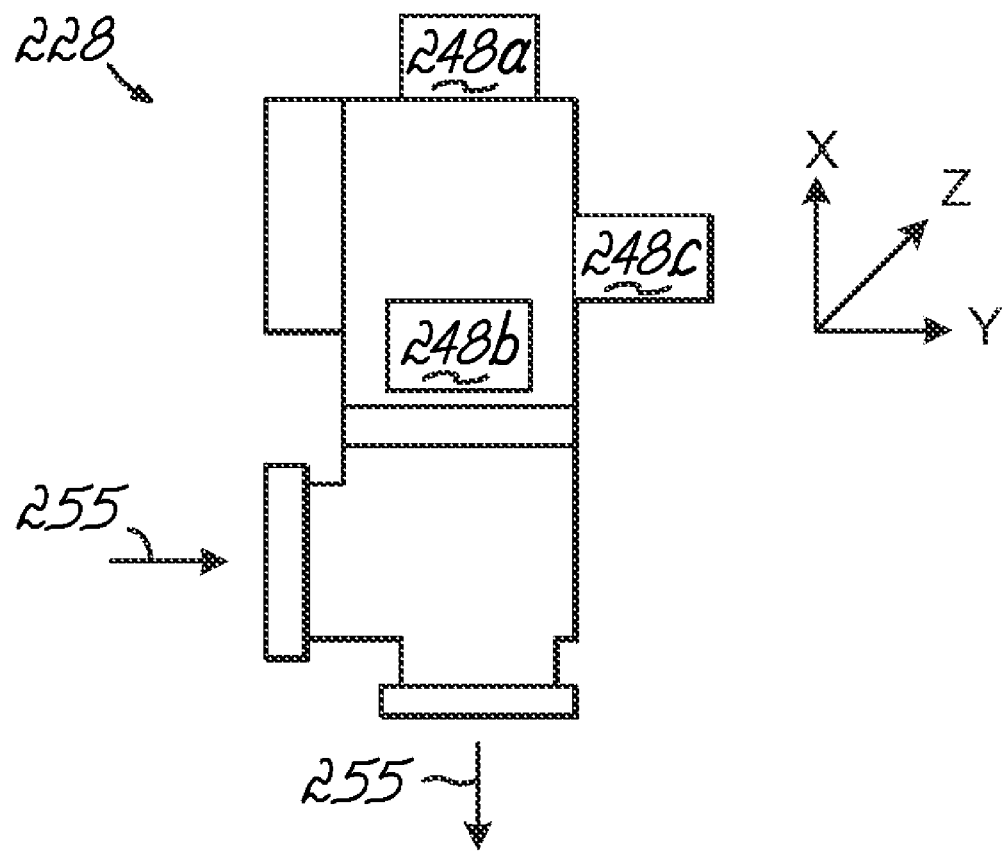
FIG. 3 is a schematic view of an automatic pressure controller having a wireless sensor network in accordance with an embodiment of the invention.

Example: vibrational signature of an automatic pressure Controller During Pressure Control in a Processing Chamber FIG. 3 is a schematic view of an automatic pressure controller 228 having a wireless sensor network in accordance with an embodiment of the invention. In the illustrated example, accelerometer sensors 248a, 248b, 248c are disposed for monitoring a vibrational signal of the automatic pressure controller 228 in response to a command to increase or decrease gas pressure upstream from the automatic pressure controller 228 during flow of a process gas 255 through the automatic pressure controller 228. The gas pressure can, for example, be in the range from 1.5 Torr to 9 Torr. For example, the accelerometer sensors 248a, 248b, 248c may be used to sense and measure x, y, z vibrations.

The automatic pressure controller 228 can, for example, be a CKD VEC pneumatic-driven gate valve from Valve & Equipment Consultants, Inc., Huffman, Tex. The automatic pressure controller 228 is typically operated under automatic pressure control to reach a setpoint pressure, but it can also be operated under full open/full close control. By monitoring a vibrational signal of the automatic pressure controller 228 during pressure controlling, a change in a condition of the automatic pressure controller 228 can be determined with high precision, including the direction of valve movement (i.e., opening or closing of the gate valve), the relative opening of the gate valve, and the time required for the opening/closing movements of the gate valve, including full opening and full closing movements.

In one example, monitoring of a vibration signal of the automatic pressure controller 228 can be utilized to measure a deviation (drift) from a desired opening/closing setpoint. If a desired valve opening/closing position is incorrect, an error signal can be generated and an appropriate action taken. In other words, a vibrational signal may be used to measure an error between an expected position of the automatic pressure controller 228 and the real position of the automatic pressure controller 228. This measurement method can be more sensitive than traditional control of the automatic pressure controller position by electronics of the automatic pressure controller 228, and the error signal and the real position of the automatic pressure controller 228 can be relayed to an operator for an appropriate action.

In another example, formation of a material deposit and/or particle formation on internal surfaces of the automatic pressure controller 228 can make the automatic pressure controller 228 "sticky", which, over time, can change the time it takes it to fully or partially close or open due to increased friction. This change in a processing state of the automatic pressure controller 228 may be sensed and monitored by the wireless sensor network.

In order to simulate various degrees of clogging of the gas exhaust line 227 in FIG. 2, solid flanges with different numbers of apertures (through holes), and thus different conductance, were inserted between the gas exhaust line 227 and the automatic pressure controller 228. Then the vibrational signals of the automatic pressure controller 228 were measured for the different flanges during operation of the automatic pressure controller 228 during automatic pressure reduction/increase at constant gas flow. The measured vibrational signals were then compared to a setup using a "fully open" flange (representing no clogging). The different solid flanges had 2, 4, or 6 apertures, where the flange with 2 apertures simulated the greatest clogging, the flange with 4 apertures simulated less clogging, etc. The results are shown in FIGS. 4A-4D.

FIGS. 4A-4D show vibrational signals from the automatic pressure controller 228 during pressure controlling according to an embodiment of the invention. The vibrational signals were measured by wireless accelerometer sensor 248b in FIG. 3 during automatic pressure controlling from 6 Torr to 3 Torr. The vibrational signals are displayed as voltage outputs from the wireless accelerometer sensor 248b as a function of elapsed time in counts (100 counts=1 sec).

Figure 4A:
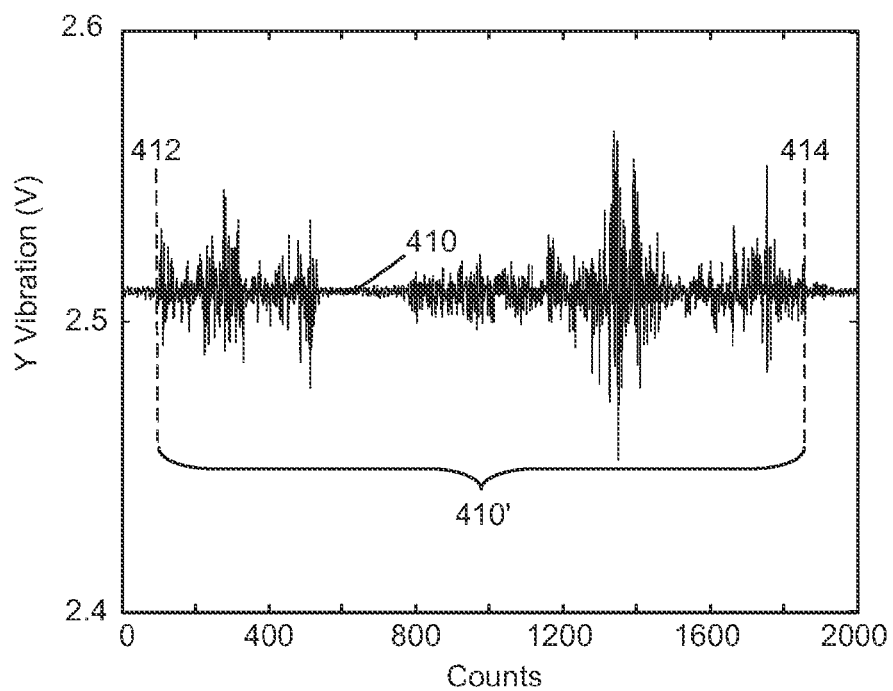
FIGS. 4A-4D show vibrational signals from an automatic pressure controller during pressure controlling according to an embodiment of the invention.

FIG. 4A shows a vibrational signal 410 during pressure controlling from 6 Torr to 3 Torr using a solid flange containing 2 apertures. At time marker 412, a command to decrease gas pressure from 6 Torr to 3 Torr is relayed to the automatic pressure controller 228 from a system controller. At time marker 414, the pressure has stabilized as shown by absence of vibrations above noise level from the automatic pressure controller 228. The vibrational signature 410' between time markers 412 and 414 is associated with movements of components of the automatic pressure controller 228 during the automatic pressure control step. The vibrational signature 410' has a time length of about 17.5 sec.

In FIG. 4A, the positions of the time markers 412 and 414 can be determined using standard mathematical techniques. In one example, at the start of the vibrational signal 410, the standard deviation of the noise in the vibrational signal 410 can be calculated, and the beginning of the vibrational signature 410' at time marker 412 determined when the vibrational amplitude of the vibrational signal 410 is 3 times the standard deviation of the noise. Analogously, the time marker 414 may be determined backwards in time from the end of the vibrational signal 410.

Furthermore, subsections within the vibrational signature 410' can be identified and used for pattern recognition. For example, the time lengths and amplitudes of the subsections may be used to determine the shapes of the subsections and the shapes fitted to signal envelopes. If the sampling frequency is high enough, wavelets within the vibrational signature 410' may be used to identify ringing patterns and the number of the wavelets compared to a baseline pattern.

Figure 4B:
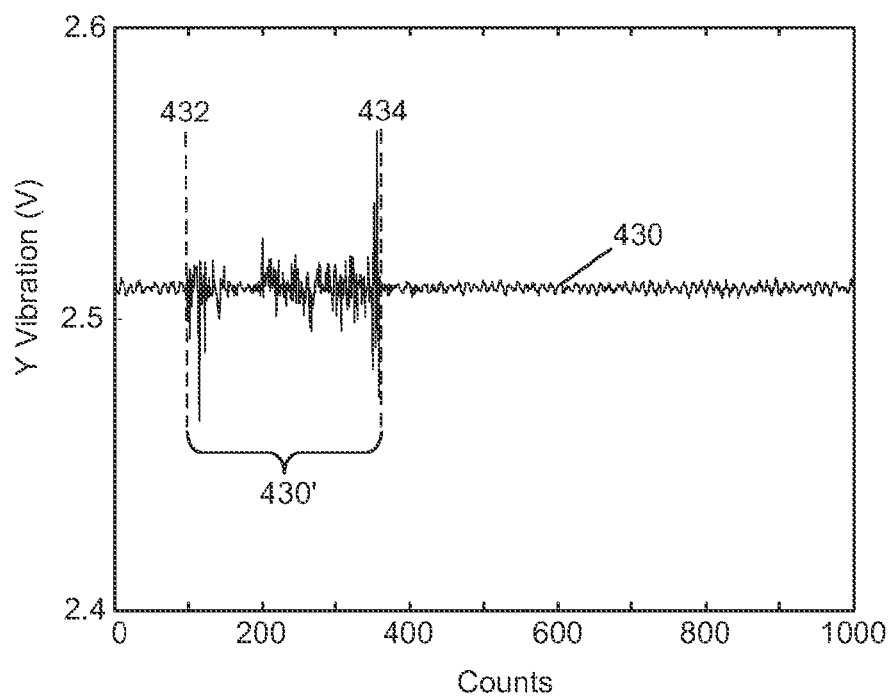
Figure 4C:
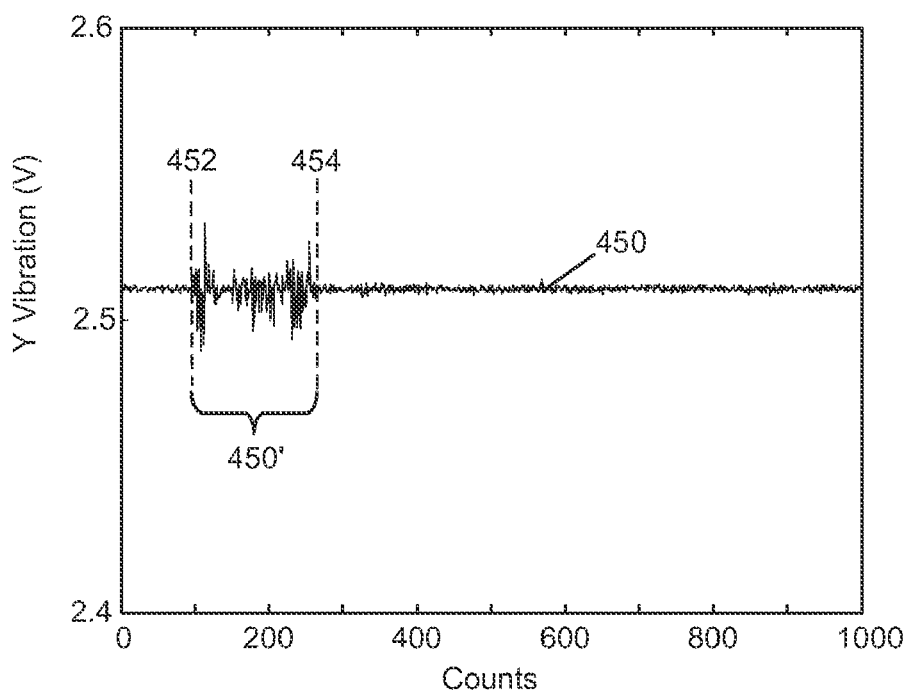
Figure 4D:
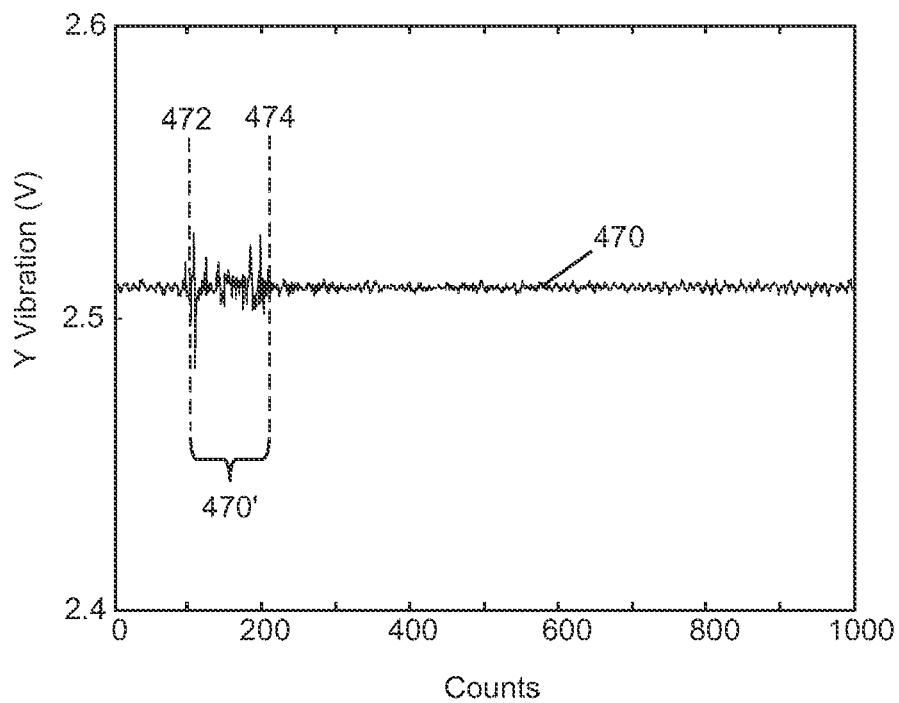

FIGS. 4B-4D show vibrational signals 430, 450, 470 during pressure controlling from 6 Torr to 3 Torr using a flange with 4 apertures (FIG. 4B), a flange with 6 apertures (FIG. 4C), and a "fully open" flange (FIG. 4D), respectively. In FIG. 4B, the vibrational signature 430' has a time length of about 2.5 sec between time markers 432 and 434. In FIG. 4C, the vibrational signature 450' has a time length of about 1.7 sec between time markers 452 and 454. In FIG. 4D, the vibrational signature 470' has a time length of about 1.2 sec between time markers 472 and 474. Comparison of the vibrational signatures 410', 430', 450', 470' demonstrates that reduced conductance (increased clogging) results in increased length of the vibrational signatures. Therefore, the length of the vibrational signatures are related to the length of time for pressure stabilization. In addition to having different lengths, the vibrational signatures 410', 430', 450', 470' have different structures, including frequency and intensity of vibrations.

Figure 5A:
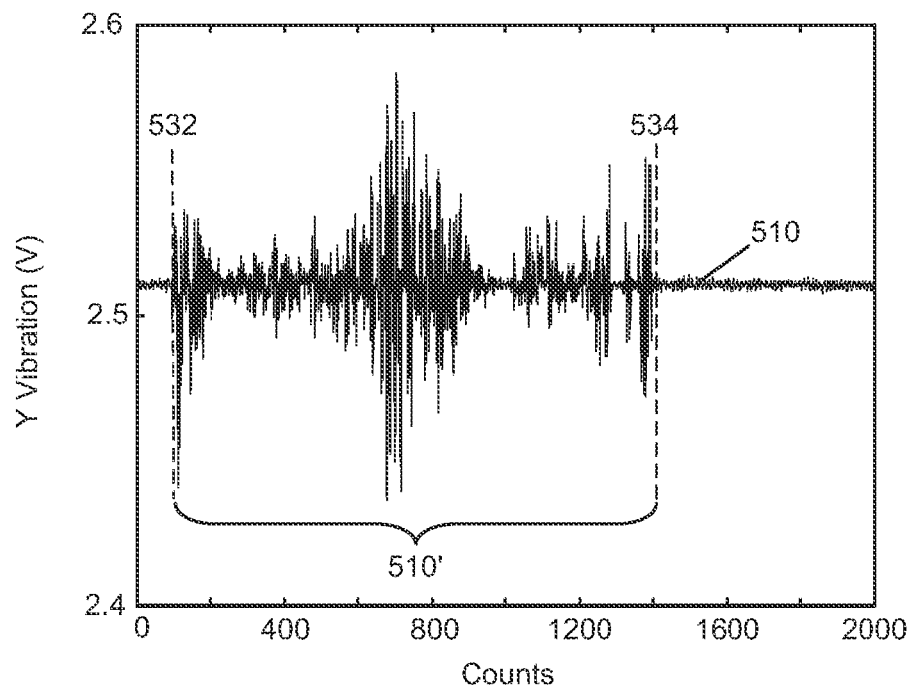
FIGS. 5A-5D show vibrational signals from an automatic pressure controller during pressure controlling according to another embodiment of the invention.

FIGS. 5A-5D show vibrational signals from the automatic pressure controller 228 during pressure controlling according to another embodiment of the invention. The vibrational signals were measured during automatic pressure controlling from 3 Torr to 9 Torr. The experimental setup was the same as in FIGS. 4A-4D. FIG. 5A shows a vibrational signal 510 during automatic pressure controlling using a flange containing 2 apertures. At time marker 512, a command to increase gas pressure from 3 Torr to 9 Torr is relayed to the automatic pressure controller from a system controller. At time marker

514, the pressure has stabilized. The vibrational signature 510' between time markers 512 and 514 has a time length of about 13.0 sec.

Figure 5B:
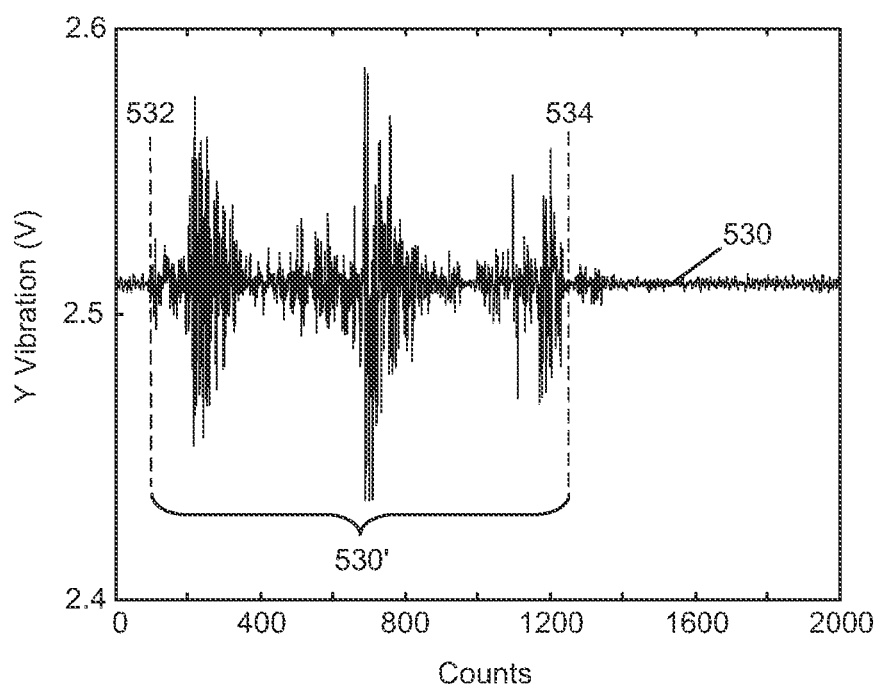
Figure 5C:
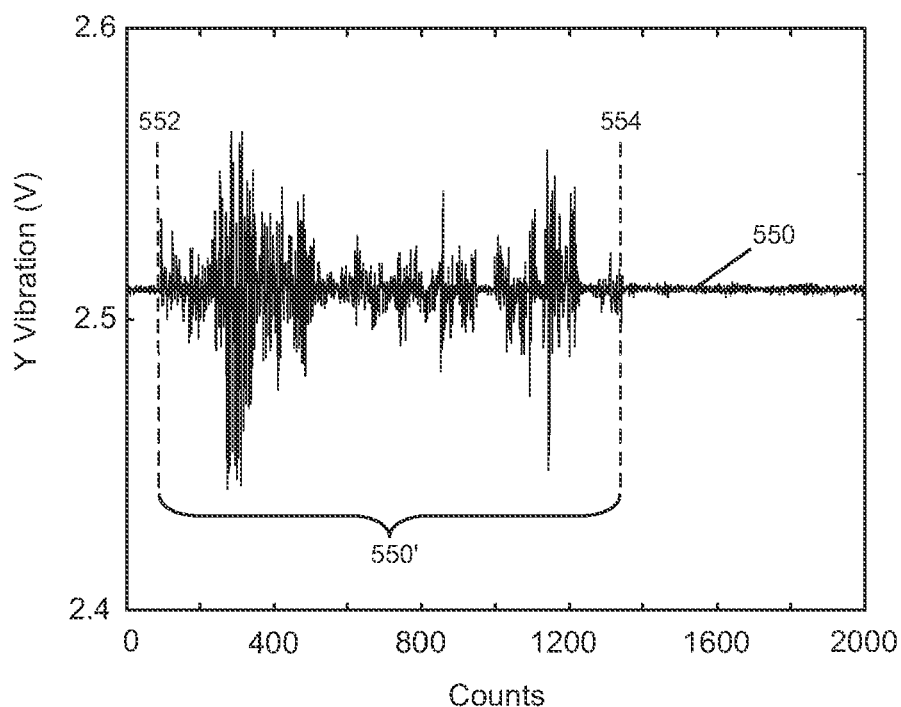
Figure 5D:
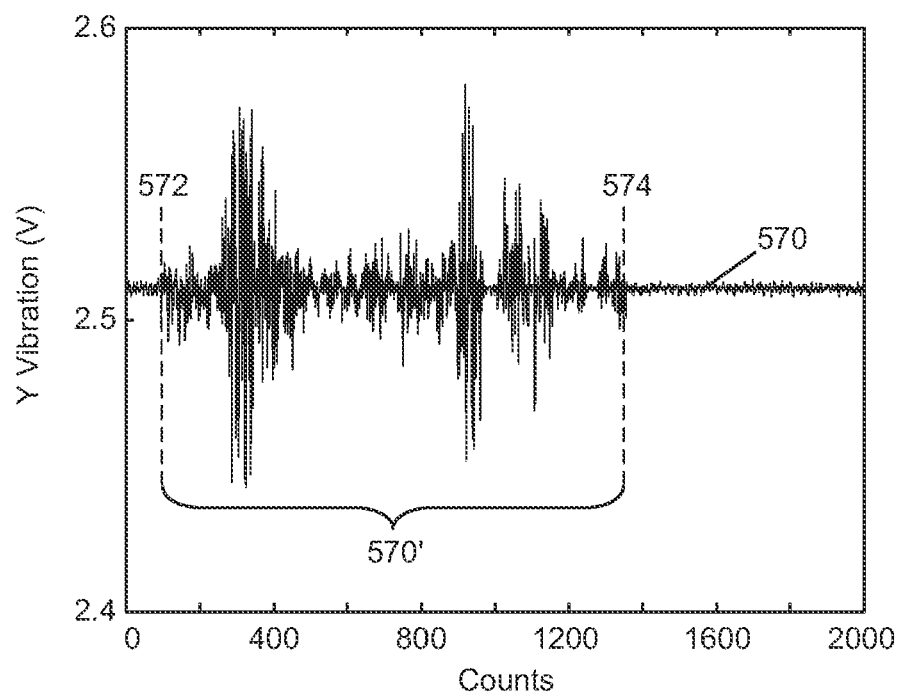

FIGS. 5B-5D show vibrational signals 530, 550, 570 from an automatic pressure controller during pressure controlling using a flange with 4 apertures (FIG. 5B), a flange with 6 apertures (FIG. 5C), and a "fully open" flange (FIG. 5D), respectively. In FIG. 5B, the vibrational signature 530' has a time length of about 11.4 sec between time markers 532 and 534. In FIG. 5C, the vibrational signature 550' has a time length of about 12.5 sec between time markers 552 and 554. In FIG. 5D, the vibrational signature 570' has a time length of about 12.5 sec between time markers 572 and 574. FIGS. 5A-5D show that the lengths of the vibrational signatures 510', 530', 550', 570' are relatively insensitive with respect the number of flange apertures. However, the vibrational signatures 510', 530', 550', 570' have different vibrational structures, including the frequency and intensity of the vibrations, that may be used to monitor a change in the gas line conductance.

Figure 6A:
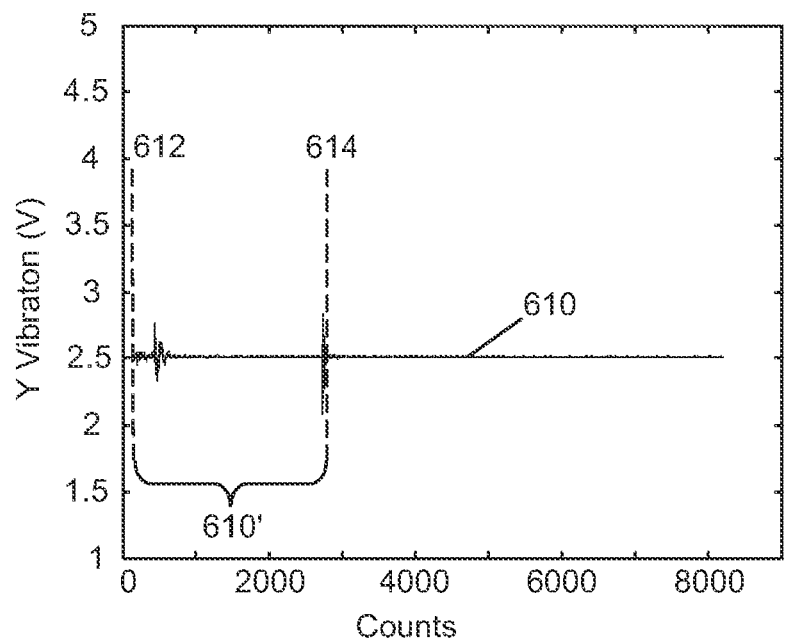
FIGS. 6A-6B shows vibrational signals from an automatic pressure controller during full valve opening from a closed valve position and during full valve closing from a fully open position according to embodiments of the invention.
Figure 6B:
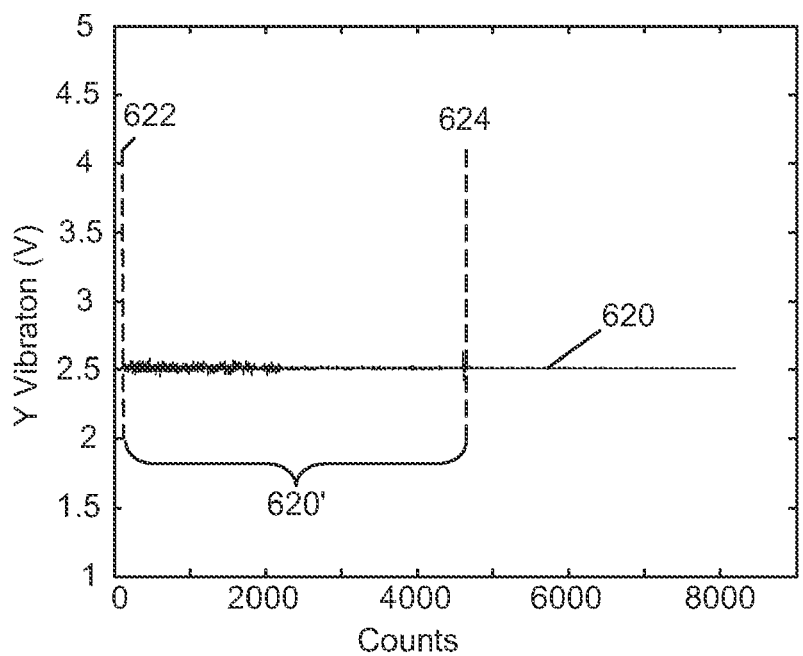

Example: Vibrational Signature of an Automatic Pressure Controller During Full Valve Opening and Full Valve Closing Steps FIGS. 6A-6B show vibrational signals 610, 620 from the automatic pressure controller 228 during full valve opening from a closed valve position (FIG. 6A) and during full valve closing from a fully open position (FIG. 6B), respectively, according to embodiments of the invention. The vibrational signals 610, 620 were measured by wireless accelerometer sensor 248b using a sampling frequency of 5 kHz. The vibrational signals 610, 620 are displayed as voltage outputs from the wireless accelerometer sensor 248b as a function of elapsed time in counts (5,000 counts=1 sec).

FIG. 6A shows a vibrational signal 610 containing a vibrational signature 610' having a time length of 0.5 sec between time markers 612 and 614. FIG. 6B shows a vibrational signal 620 containing a vibrational signature 620' having a time length of 1 sec between time markers 622 and 624. The vibrational signature 610' is characterized by the sharp vibrational features near time markers 612 and 614. However, the vibrational signature 620' is characterized by a broad vibrational feature near time marker 622 and a sharp vibrational feature near time marker 624.

According to an embodiment of the invention, the difference in the vibrational signatures 610' and 620' may be used to determine whether the valve of the automatic pressure controller 228 is being fully opened from a closed position or being fully closed from a fully open position. Furthermore, the time duration of the vibrational signatures may be compared to baseline time periods to determine if the time duration of the vibrational signatures changes over time, for example due to increased friction from material deposits in the automatic pressure controller. In one example, changes in the time duration of a vibrational signature during valve opening or valve closing may affect processes where fast valve opening or valve closing is essential to synchronize gas flows. In addition, if there is a change in the time duration of a vibrational signature compared to a baseline time period, then the real processing conditions may differ from the expected processing conditions. For example, incomplete closing from a fully open position can lead to small amounts of gas leakage that can affect gas concentrations in the process chamber.

Example: Vibrational Signature of a Gas Line During Process Gas Flow

Under certain flow conditions, flow of a process gas through gas lines found in semiconductor manufacturing systems (e.g., thermal processing system 200 in FIG. 2), can develop high levels of noise and vibrations. For example, process gas flow through gas supply line 242 or gas exhaust line 227, can excite a standing wave, resulting in vibrations in the gas line that can be greatly amplified if acoustic or structure resonance occurs. A clean gas line may produce a baseline vibrational signature as a process gas flows through the system component, and changes in the vibrational signature of the gas line can indicate a change in the dynamic characteristics of the gas line (e.g., formation of a material deposit in the gas line) and the overall processing system. The changes may be analyzed and compared to a baseline vibrational signature in order to diagnose a drift or a failure in the processing system so that appropriate correcting measures can be taken.

Figure 7A:
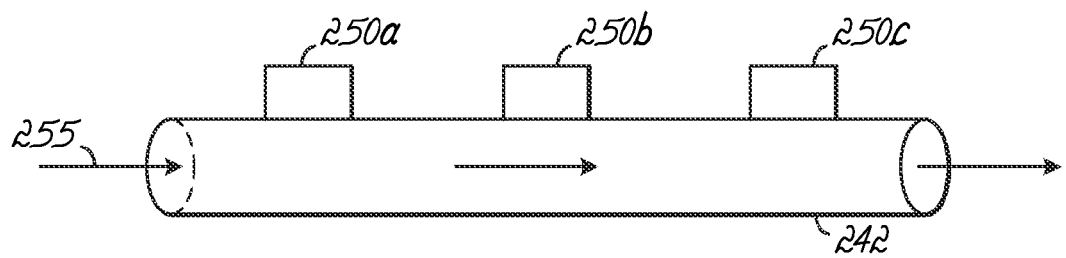
FIGS. 7A-7B are schematic perspective views of a gas feed line having a wireless sensor network in accordance with an embodiment of the invention.
Figure 7B:
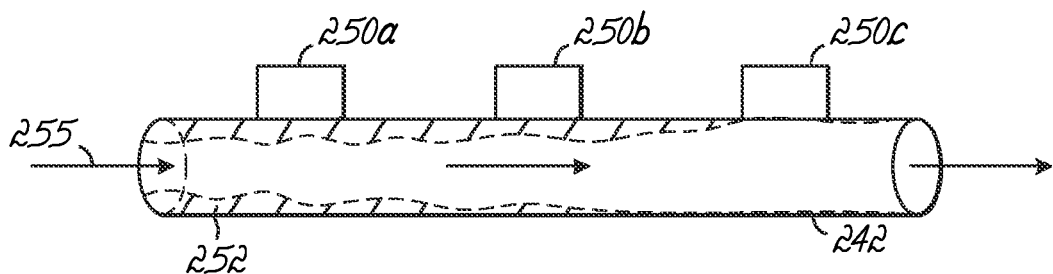

FIGS. 7A-7B are schematic perspective views of a gas feed line 242 having a wireless sensor network in accordance with an embodiment of the invention. The gas feed line 242 can, for example, be a 4" diameter steel pipe, and can have any shape. As described in reference to FIG. 2, wireless accelerometer sensors 250a-250c may be disposed on the outside of the gas feed line 242 for monitoring a vibrational signal from the gas feed line 242 as process gas 255 flows to the inner tube 202a. As the process gas 255 flows through the clean gas feed line 242 in FIG. 7A, a baseline vibrational signature may be determined from a vibrational signal measure by the wireless accelerometer sensors 250a-250c. The vibrational signatures measured by each sensor 250a-250c can be decoupled from each other and from other vibrations present on the gas feed line 242, e.g., vibrations from vacuum pumps and other mechanical devices in the thermal processing system 200. Although the accelerometer sensors 250a-250c are shown mounted onto a linear section of the gas feed line 242, this is not required, as one or more of the accelerometer sensors 250a-250c may be mounted on one or more non-linear sections of the gas feed line 242. Alternately, a different number and/or type of sensors may be used.

A problem commonly encountered with gas feed line 242 is clogging of the line due to buildup of a material deposit on the inner walls of the gas feed line. Common locations for material deposit buildup in the line include right angle bends, areas where heating is reduced or absent, and locations far away from the processing chamber 202. Material buildup in the gas feed line 242 can be sensed, monitored, and determined by vibrations created by the flow of a process gas through the gas feed line, vibrations created by a vacuum pump or an automatic pressure controller, or vibrations that are manually induced.

FIG. 7B schematically shows a material deposit 252 formed on an inner surface of the gas feed line 242 caused by flowing of the process gas 255 through the gas feed line 242. For example, the material deposit 252 can result from flowing a process gas for a chemical vapor deposition (CVD) process. In one example, the process gas 255 can contain a metal precursor such as $Hf(OBu^t)_4$ and the buildup of a material deposit 252 can be caused by premature decomposition of the $Hf(OBu^t)_4$ precursor over time in the gas feed line 242. In another example, the material deposit 252 can be a nitride such as SiN. The presence of the material deposit 252 reduces the effective inner diameter of the gas feed line 242 and increases the total mass of the gas feed line 242, thereby changing the characteristics of the gas flow 255 through the gas feed line 242 and the vibrational signature produced by the process gas flow 255 and measured by the wireless accelerometer sensors 250a-250c. Furthermore, an increase in the mass of the gas feed line 242 can decrease the amplitude of the fundamental vibration frequency or its harmonics. As depicted in FIG. 7B, the thickness of the material deposit 252 can vary along the length of the gas feed line 242, thereby resulting in different vibrational signatures measured by the accelerometer sensors 250a-250c. The vibrational signatures can be compared to baseline values and the level of material deposition determined. The baseline values can, for example, contain threshold values, including historical threshold values.

Figure 8A:
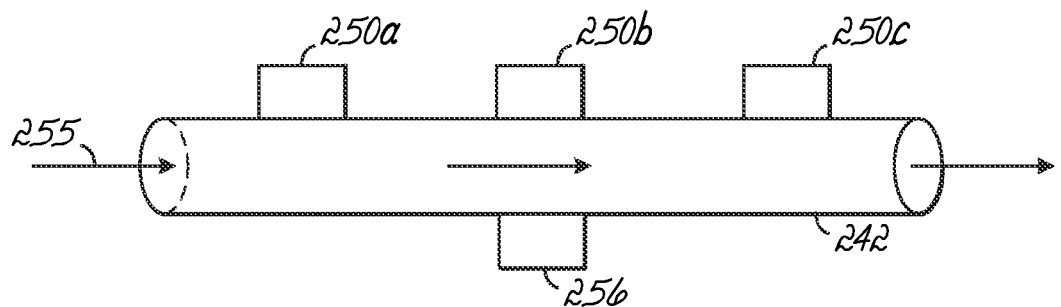
FIGS. 8A-8B are schematic perspective views of a gas feed line having a wireless sensors network in accordance with another embodiment of the invention.
Figure 8B:
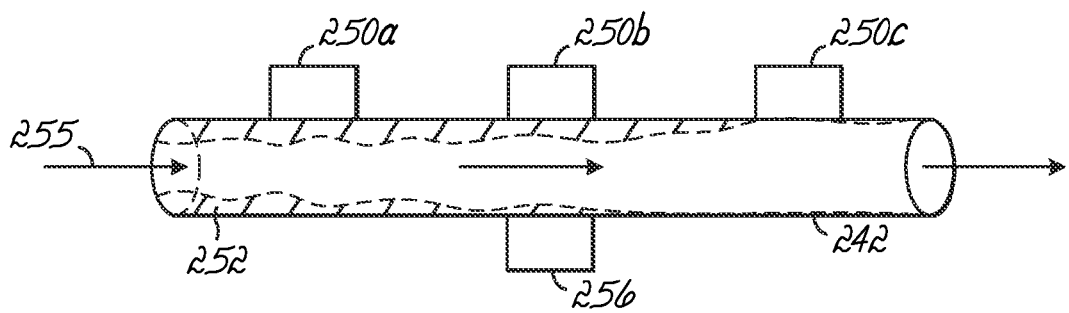

FIGS. 8A-8B are schematic perspective views of a gas feed line having a wireless sensors network in accordance with another embodiment of the invention. In FIGS. 8A-8B, the gas feed line 242 further contains a vibration source 256 disposed on an outer surface of the gas feed line 242. The vibration source 256 can, for example, be an ultrasonic vibration source configured for producing vibrations in the gas feed line 242 that can be sensed and monitored by the wireless accelerometer sensors 250a-250c. The presence of the material deposit 252 can change the vibrational signature produced by the vibration source 256 and sensed and monitored by the accelerometer sensors 250a-250c. The vibration signals produced by the vibration source 256 and the gas flow 255 can be decoupled using standard mathematical analysis methods.

Referring back to FIG. 2, in another or further embodiment, four sensors 247a-247d are disposed on the outside of the gas exhaust line 227. The sensors 247a-247d can, for example, measure temperature and/or vibrations of the gas exhaust line 227. Alternately, a different number and/or type of sensors may be used. The sensors 247a-247d can be disposed corresponding to a predetermined mounting pattern on the gas exhaust line 227. Similarly, as described above in reference to FIGS. 7A-7B, a buildup of a material deposit on an inner surface of the gas exhaust line 227 reduces the effective inner diameter (and thus the conductance) of the gas exhaust line 227 and increases the total mass of the gas exhaust line 227, thereby changing the characteristics of exhaust gas flow through the gas exhaust line 227 and the vibrational signature produced by the exhaust gas and measured by the accelerometer sensors 247a-247d. In addition, formation of a material deposit and/or particle formation on internal surfaces of the gas exhaust line 227 can increase backflow of particles into the processing chamber 202. According to one embodiment of the invention, the gas exhaust line 227 can further contain an ultrasonic vibration source (not shown) disposed on an outer surface of the gas exhaust line 227.

According to embodiments of the invention, changes in a vibrational signature may be used to estimate level of clogging in a gas feed line or a gas exhaust line. This estimation of level of clogging can then be used to better manage the maintenance schedule of the processing system. In one example, when the level of clogging has been estimated, a decision may be made to perform additional deposition processes before performing system maintenance (e.g., cleaning of the processing system).

According to one embodiment of the invention, vibrational measurements performed on a gas line, such as a gas feed line or a gas exhaust line, may indicate a processing state of a system component or an event in the process chamber of the processing system. For example, a vibrational signal measured on a gas line may be used to detect whether or not a substrate holder containing wafers is present in the process chamber, as well as how many wafers are present. Such detection may provide additional levels of safety and processing control.

According to another embodiment of the invention, vibrational measurements performed on a gas line, such as a gas feed line or a gas exhaust line, or on a vacuum pump, may be utilized to detect a processing state of the vacuum pump and the overall health and behavior of the vacuum pump.

According to another embodiment of the invention, vibrational signatures of both a gas feed line and a gas exhaust line may be related to the behavior of the process chamber and/or process gas flow, and can indicate that an appropriate action should be taken. For comparison, a different action may be taken if the vibrational signature of only the gas feed line or the gas exhaust line are measured.

According to one embodiment of the invention, the exemplary sensors 247a-247d, 248a-248c, 249a-249b, 250a-250c depicted in FIGS. 2-8 can be mote-based sensors (motes) that can serve as a platform for building a wireless sensor network. Motes are an open hardware/software platform for sensing applications. The mote platform consists of four basic components: power, computation, sensor(s) (e.g., accelerometer or temperature sensor(s)), and communication. With these components, a mote is capable of autonomy and interconnection with other motes. The motes are self-contained, battery-powered computers with radio links, which enable them to communicate and exchange data with one another, deliver data to a desired destination such as a computer, and to self-organize into ad hoc networks.

The use of motes to form a wireless sensor network allows for easy deployment of sensors, provides flexibility in adding and replacing sensors, and allows clustering of sensors to be defined physically or logically as virtual clusters. When installed on components of the processing system, the wireless sensor network can be configured by hardware definitions based on knowledge of the processing system and components of the processing system. In addition, the wireless sensor network can be reconfigured dynamically at the hardware level (physical reconfiguration) or at the software level (logical or virtual reconfiguration).

The use of motes to form a wireless sensor network allows for employing a variety of different sensors and collecting comprehensive sensor data. The collected data can provide insight about the performance or the condition of the processing system, including direct or enhanced/processed intelligent information about the performance or the condition of the processing system. The data can be obtained by short, mid, or long-term data collection and can be obtained from spatially or temporally dispersed sensors. In addition, the data may be obtained from a cluster of similar or dissimilar sensors being sampled at the same or different rates. Furthermore, the use of motes can provide new approaches for identifying and replacing appropriate parts of the processing system when needed. This is due to the increased number of sensors utilized compared to prior methods that utilize more generic approaches that are not able to pinpoint problems.

Information about the performance or condition of the semiconductor processing system allows for further increasing the details of the monitoring and the resulting diagnostics of the characteristics of the processing system. This can include increasing the accuracy and confidence in predicting the performance or condition of the processing system. Predicting the performance or condition of the processing system allows for monitoring normal system performance and identifying drift in a processing state of the processing system or abrupt failures, in addition to increased effectiveness in maintaining and servicing the processing system. Furthermore, detailed understanding of the performance or condition of the processing system can aid in choosing, adding, and configuring additional sensors.

According to embodiments of the invention, the use of motes and a wireless sensor network on semiconductor processing systems provides means for collecting a variety of new types of data, which has not been available until now. This new type of data can be based on different types of mote sensors located at close proximity to a single or several points of interest on the processing system, depending on the process to be performed. For example, temperature data can be collected at one point of interest and vibration data collected at another point of interest. In another example, data can be collected from same or similar types of sensors located at close proximity to a single point of interest and provide redundancy. In yet another example, data can be collected from same or similar types of sensors located at several points of interest and thereby provide a snapshot at a given instant of the performance or condition of the processing system or components of the processing system.

The wireless sensor network can include a plurality of mote sensors that can be configured using a mesh network, star network, a cluster network, or other networks. According to an embodiment of the invention, applying advanced networking technology to mass-produced wireless sensors such as motes can form a new kind of monitoring system where the network literally becomes the sensor. In one example, the sensors can continuously monitor a processing state of a system component and a query may be sent to a system controller (e.g., computer) when a sensor signal exceeds a threshold value, where the timing of the query may be controlled by the sensor network, independent of the controller. The motes ad-hoc, multihop networking capabilities make it possible to deploy a large network of sensors that was never before possible. This provides sensing closer to the physical phenomena with a higher granularity than previously possible. Additionally, novel software enables the raw data collected by the sensors to be analyzed in various ways before it even leaves the network.

Figure 9:
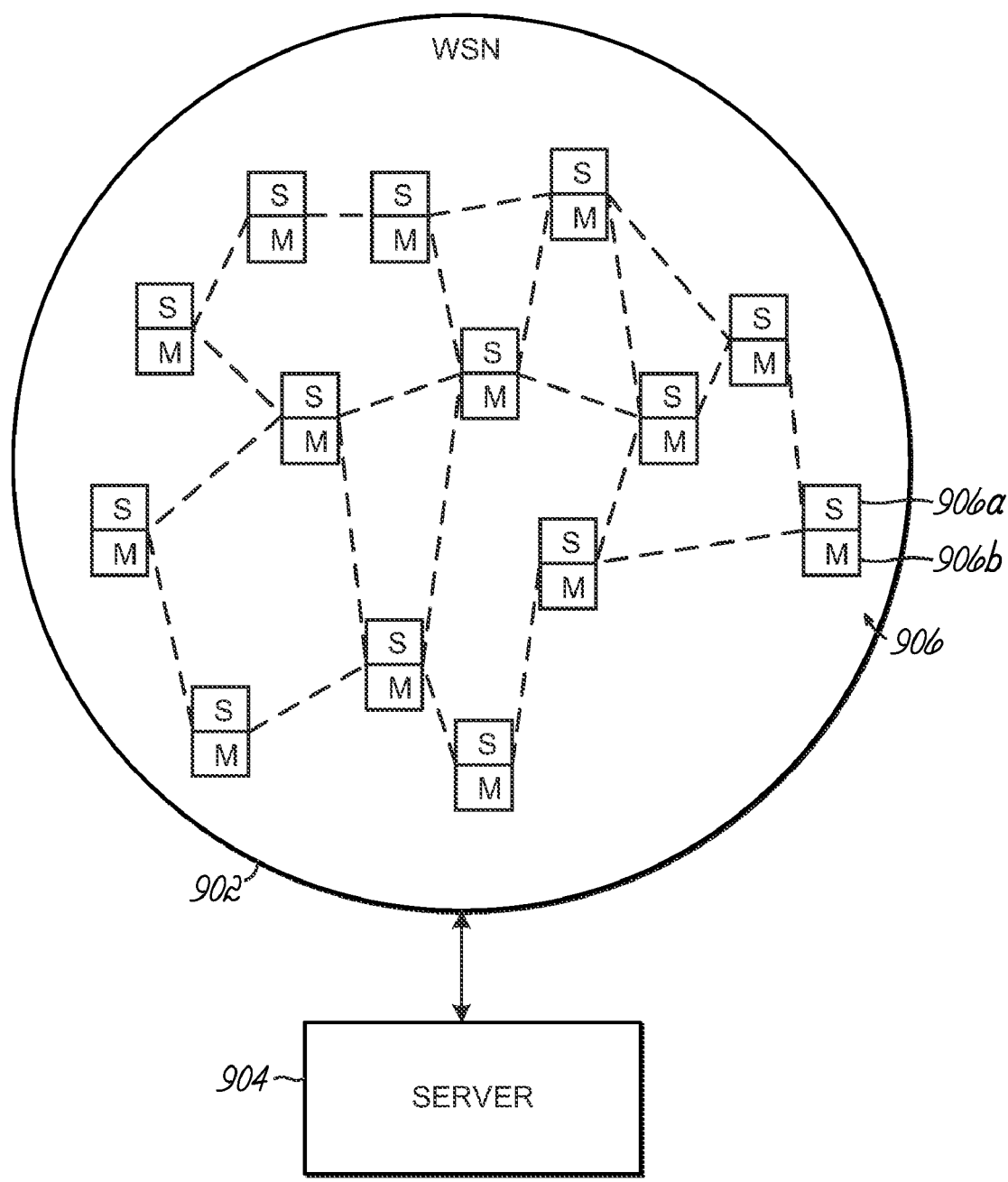
FIG. 9 is a diagrammatic view of a wireless sensor network configuration according to an embodiment of the invention.

FIG. 9 is a diagrammatic view of a wireless sensor network configuration according to an embodiment of the invention. The exemplary wireless sensor network (WSN) 902 is a mesh network containing a plurality of wireless sensors 906 mounted on one or more components of a processing system, with each wireless sensor 906 containing a sensor 906a and a mote 906b. The wireless network 902 can exchange a sensor signal with a server 904. Due to data processing capabilities of the motes 906b, the sensor signal may be at least partially processed by the wireless sensor network 902 prior to extraction of the sensor signal (data) to the server (controller) 904 for further processing and analysis. The sensor signal can be utilized for diagnosing and predicting the processing state of a system component and the overall condition of the semiconductors processing system, including predicting any potential degradation or drift in the processing system and any abrupt failures.

As for software, the motes platform can utilize TinyOS, which is an open source, small event-driven operating system for wireless embedded sensor networks with support for efficiency, modularity, and concurrency-intensive operation. At its most basic level, TinyOS is a scheduler that manages the activities of its various modular components and manages power on the mote. Networking and routing layers reside on top of the TinyOS base to provide multi-hop functionality. The wireless network is self-organizing on startup and has mechanisms to repair failed links and circumvent failed nodes.

For a wireless sensor network to be widely deployed, it must be relatively simple to extract data from the network with low bandwidth load on the network. For example, TinyDB is a database system that can be utilized for extracting the data. At its most basic level, TinyDB can transform diverse types of wireless sensor networks into user-friendly databases with useful information about a processing system. TinyDB greatly streamlines the process of extracting data by enabling a user to gather the same information just by posing a simple query in SQL, a common database language. Through a graphical user interface (GUI), the software describes what sensor readings are available. Meanwhile, TinyDB's declarative query language enables the user to describe the desired data without having to tell the software how to acquire that data. The query is then sent to the TinyDB query processor pre-installed on each mote. If a mote happens to be relaying a massage related to an unfamiliar query, it simply asks the neighboring mote that sent the message for a copy of the query so it too can gather the data. Once a query is executed, TinyDB automatically extracts the data from the network and dumps it into a traditional database. The information can then be analyzed using standard tool and visualization techniques.

Each of the sensors may provide some form of identification allowing a controller to distinguish which sensor is reporting (i.e., emitting a signal). Identification means may include broadcasting a unique address tone, or bit sequence, broadcasting in a pre-assigned time slot, or broadcasting on an allocated frequency.

According to one embodiment of the invention, microelectro-mechanical systems (MEMS) may be used to form a variety of sensors, for example accelerometer sensors, thermometers, and low-power radio components that can be pin size. MEMS can be used to combine the sensor, the logic, and computing capabilities at the sensor location.

Referring back to FIG. 2, the controller 290 can be used to control process parameters, such as a temperature of a process gas, a gas flow rate, and pressure in the processing chamber 202. The controller 290 can receive output signals from the sensors 247a-247c, 248a-248b, 249a-249b, 250a-250c and can send output control signals to the automatic pressure controller 228 and the flow rate adjusters 244, 245, 246. In addition, the controller 290 can receive output signals from temperature sensors (not shown) in the furnace system 205 and can send output control signals to electric power controllers 236-240. A method of monitoring a thermal processing system in real time using temperature sensors in the furnace 205 is described in U.S. patent application Ser. No. 11/217,276, titled "Built-In Self-Test (BIST) for a Thermal Processing System," filed on Sep. 1, 2005, the entire content of which is hereby incorporated by reference herein.

Setup, configuration, and/or operational information can be stored by the controller 290, or obtained from an operator or another controller, such as controller 190 (FIG. 1). Controller 290 can also use historical data to determine the action to be taken during normal processing and the actions taken on exceptional conditions.

Controller 290 can determine when a process is paused and/or stopped, and what is done when a process is paused and/or stopped. In addition, the controller 290 can determine when to change a process and how to change the process. Furthermore, the controller 290 rules can determine when to allow system operations to change based on the dynamic state of the processing system.

In one embodiment, controller 290 can include a processor 292 and a memory 294. Memory 294 can be coupled to processor 292, and can be used for storing information and instructions to be executed by processor 292. Alternatively, different controller configurations can be used. In addition, system controller 290 can include a port 295 that can be used to couple controller 290 to another computer and/or network (not shown). Furthermore, controller 290 can include input and/or output devices (not shown) for coupling the controller to the furnace system 205, exhaust system 210, and gas supply system 260.

Memory 294 can include at least one computer readable medium or memory for holding computer-executable instructions programmed according to the teachings of embodiments of the invention and for containing data structures, tables, rules, and other data described herein. Controller 290 can use data from computer readable medium memory to generate and/or execute computer executable instructions. The furnace system 205, exhaust system 210, gas supply system 260, and controller 290 can perform a portion or all of the methods of the embodiments of the invention in response to the execution of one or more sequences of one or more computer-executable instructions contained in a memory. Such instructions may be received by the controller from another computer, a computer readable medium, or a network connection.

Stored on any one or on a combination of computer readable media, embodiments of the invention include software for controlling the furnace system 205, exhaust system 210, gas supply system 260, and controller 290, for driving a device or devices for implementing the invention, and for enabling one or more of the system components to interact with a human user and/or another system. Such software may include, but is not limited to, device drivers, operating systems, development tools, and application software. Such computer readable media further includes the computer program product of the present invention for performing all or a portion (if processing is distributed) of the processing performed in implementing the invention.

Controller 290 can include a GUI component (not shown) and/or a database component (not shown). In alternate embodiments, the GUI component and/or the database component are not required. The user interfaces for the system can be web-enabled, and can provided system status and alarm status displays. For example, a GUI component (not shown) can provide easy to use interfaces that enable users to: view status; create and edit charts; view alarm data; configure data collection applications; configure data analysis applications; examine historical data, and review current data; generate e-mail warnings; view/create/edit/execute dynamic and/or static models; and view diagnostic screens, in order to more efficiently troubleshoot, diagnose, and report problems.

Figure 10:
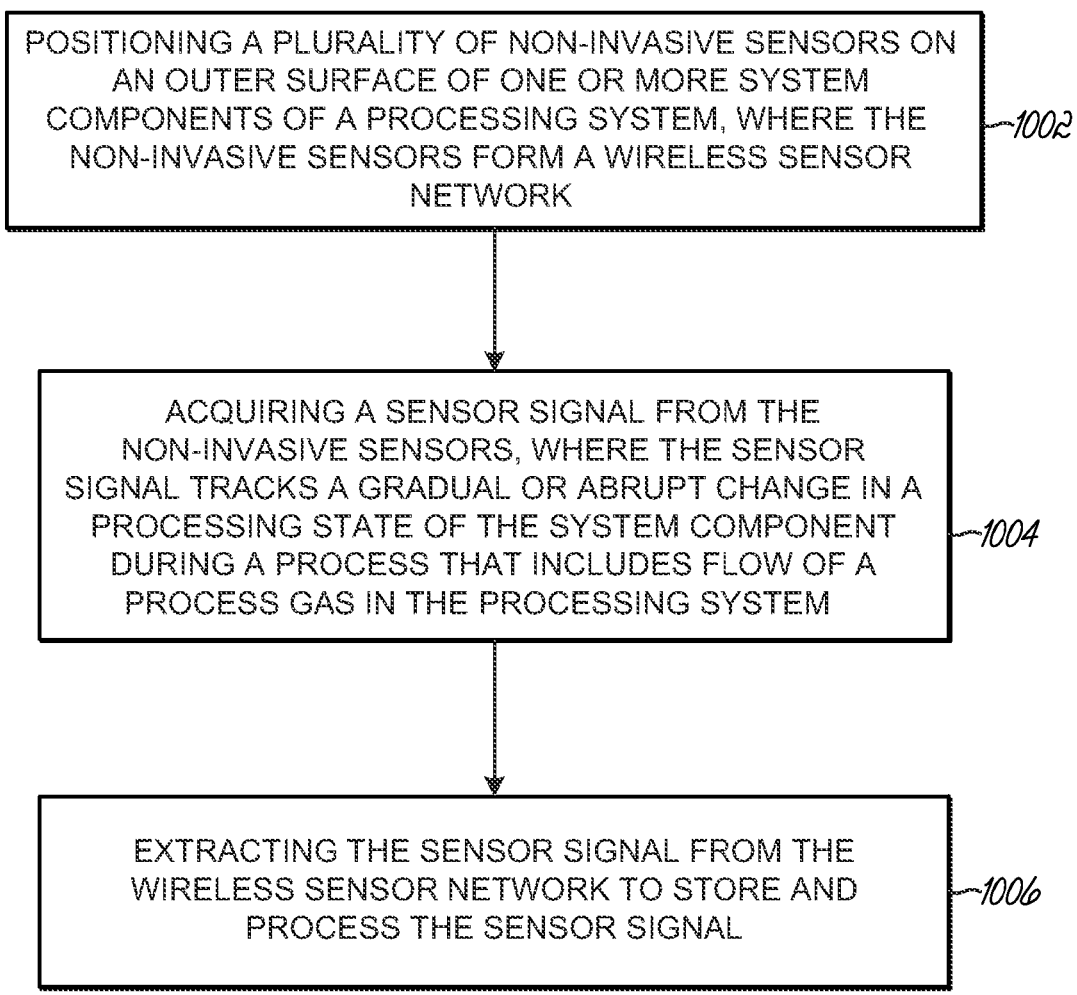
FIG. 10 illustrates a simplified flow diagram of a method of monitoring a processing state of a system component of a semiconductor processing system according to an embodiment of the invention.

FIG. 10 illustrates a simplified flow diagram of a method of monitoring a processing state of a system component of a semiconductor processing system according to an embodiment of the invention.

In step 1002, a plurality (i.e., two or more) of non-invasive sensors are positioned on an outer surface of one or more system components to be monitored in a processing system. The non-invasive sensors can, for example, be mote-based accelerometer sensors and/or thermocouple sensors that form a wireless sensor network.

In step 1004, a sensor signal is acquired from the sensors in the wireless sensor network of step 1002. The sensor signal tracks a gradual or abrupt change in a processing state of at least one of the monitored system components during flow of a process gas in contact with the one or more system components in the processing system. In one example, a processing state of a gas line may proportional to the conductance of the gas line, e.g., a gas exhaust line or a gas feed line, where the conductance may change due to formation of material deposit on an inner surface of the gas line. In another example, a processing state of an automatic pressure controller containing a valve may be the time it takes the valve to stabilize its movements in response to a command to increase or decrease pressure in a processing chamber, direction of valve movement (i.e., opening or closing of the valve), or the relative opening or closing of the valve.

In step 1106, the sensor signal is extracted from the wireless sensor network to a system controller that identifies, stores, and processes the sensor signal. The processed signal may be used to recommend the line of action, including adjusting processing parameters, or performing maintenance and repair based on historical data and other predictive methods.

In one example, the sensor signal can represent a baseline condition, e.g., a vibrational signature of an automatic pressure controller with no material deposits. Subsequently, changes in the baseline condition can be identified from changes in the vibrational signature to diagnose the processing state of the automatic pressure controller and to take an appropriate action. An automation of such a procedure will improve maintenance methods in the long run.

In addition to sensing, monitoring, diagnosing, and predicting a processing state of individual system components, further embodiments of the invention include diagnosing and predicting substrate (wafer) processing conditions during processing from a processing state of the system component. For example, changes in conductance of the gas feed line 242 due to formation of material deposits 252 in the gas feed line 242 will result in reduced amount of a precursor (e.g., $Hf(OBu^t)_4$) delivered to the processing chamber 202 by the process gas 255 and, hence, a film with a reduced thickness will be formed on the semiconductor wafer W. In another example, changes in the conductance of the gas exhaust line 227 due to formation of a material deposit and/or particle formation on internal surfaces of the gas exhaust line 227 can be correlated to the amount of byproducts removed from the processing chamber 202 and the thickness of a film formed on the semiconductor wafer W.

Thus, according to embodiments of the invention, substrate processing conditions and substrate processing results (e.g., deposited film thickness or etched film thickness) may be correlated with precursor delivery to the processing chamber 202 and/or byproduct removal from the processing chamber 202. Subsequently, the substrate processing conditions may be adjusted to achieve the desired substrate processing result, i.e., the information from the wireless sensor network may be used as a process control method.

Figure 11:
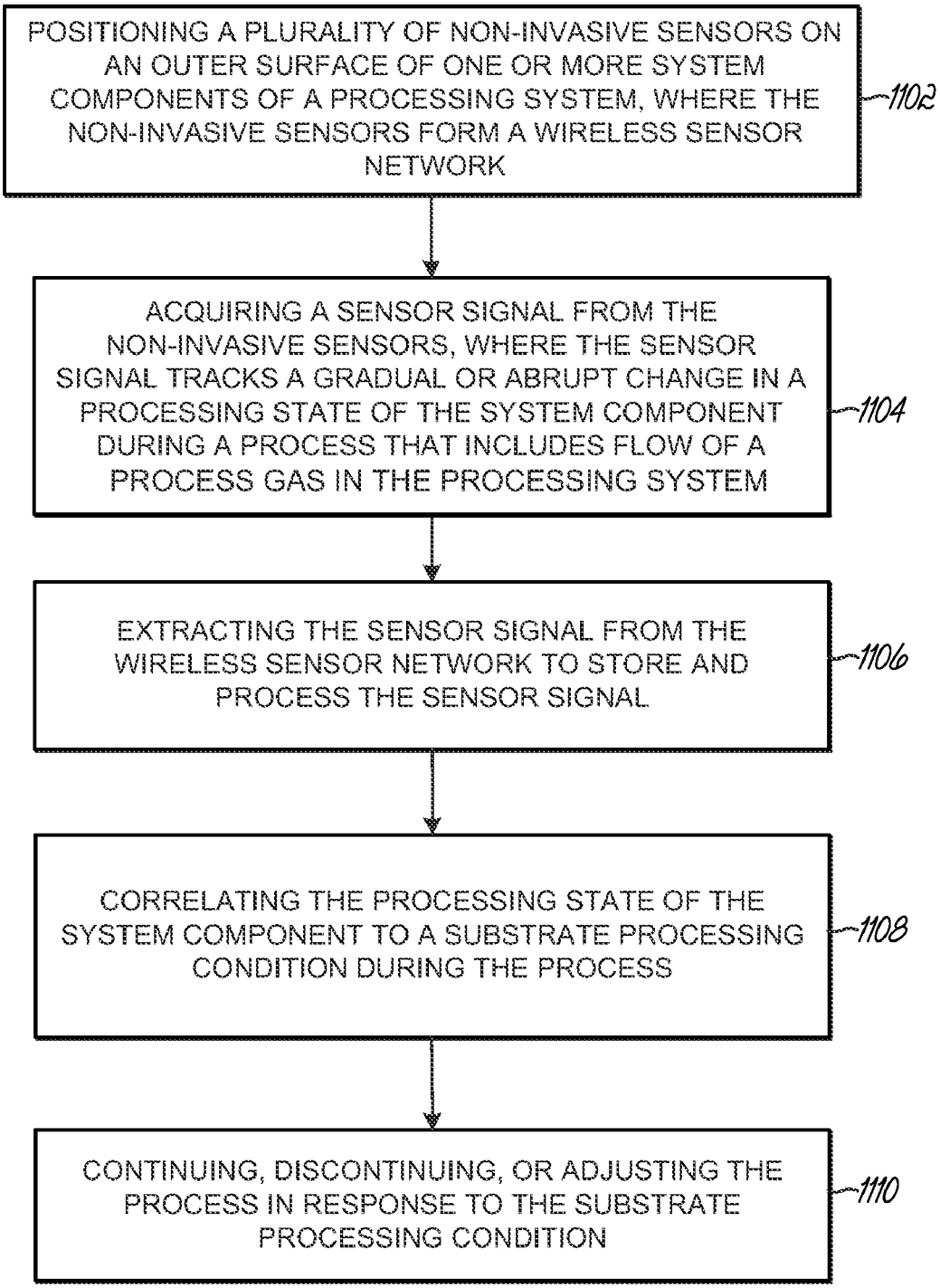
FIG. 11 illustrates a simplified flow diagram of a method of monitoring a substrate processing condition of a semiconductor processing system according to an embodiment of the invention.

FIG. 11 illustrates a simplified flow diagram of method of monitoring a substrate processing condition of a semiconductor processing system according to an embodiment of the invention.

In step 1102, a plurality of non-invasive sensors are positioned on an outer surface of one or more system components to be monitored in a processing system. The non-invasive sensors can, for example, be mote-based accelerometer sensors and/or thermocouple sensors that form a wireless sensor network.

In step 1104, a sensor signal is acquired from the wireless sensor network of step 1102. The sensor signal tracks a gradual or abrupt change in a processing state of at least one of the monitored system components during flow of a process gas in contact with the one or more system components in the processing system. According to one embodiment of the invention, the sensor signal may be a vibrational signature sensed and monitored by accelerometer sensors positioned on a gas line such as a gas feed line or a gas exhaust line, and the processing state may be a thickness of a material deposit on an inner surface of the gas line. According to another embodiment of the invention, the sensor signal may be vibrational signature sensed and monitored by accelerometer sensors positioned on a gas line, an automatic pressure controller, or a flow rate adjuster.

In step 1106, the sensor signal is extracted from the wireless sensor network to a system controller that stores and processes the sensor signal.

In step 1108, the processing state of the system component is correlated to a substrate processing condition in a manufacturing process performed in a process chamber of the processing system.

In step 1110, the manufacturing process is continued, discontinued, or adjusted in response to the substrate processing condition.

Figure 12:
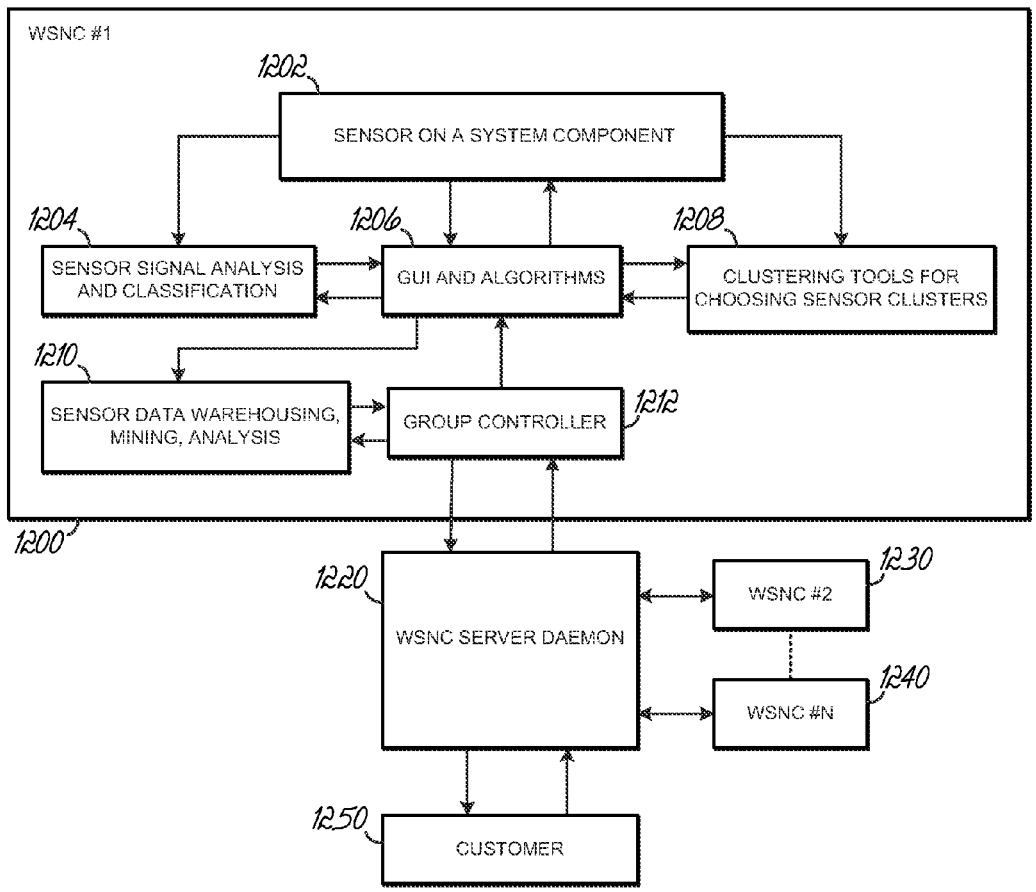
FIG. 12 is a schematic view of a wireless sensor network architecture according to an embodiment of the invention.

FIG. 12 is a schematic of a wireless sensor network architecture according to an embodiment of the invention. The exemplary wireless sensor network architecture includes a plurality (N) of wireless sensor network clusters (WSNC), including WSNC #1 1200, WSNC #2 1230, and WSNC #N 1240. The WSNC #1-WSNC #N exchange data with a WSNC server daemon 1220, which in turn exchanges data with a customer 1250 (e.g., a web-based client).

Subsystems of the WSNC #1 1200 will now be described. The subsystems include a sensor system (one or a plurality of sensors) on system component 1202, sensor signal analysis and classification module 1204, GUI and algorithms module 1206, clustering tools for choosing sensor clusters module 1208, sensor data warehousing, mining, and analysis module 1210, and group controller module 1212.

As described above, embodiments of the invention contemplate the use of arrays of identical or different sensors on a system component 1202, including sensors that measure light emission/absorption, temperature, vibrations, pressure, humidity, current, voltage, or tilt. Examples of sensors that measure vibrations are mote-based accelerometer sensors and sensors that measure temperatures are mote-based thermocouples.

The sensor data warehousing, mining, and analysis module 1210 may be is configured for interfacing the module 1202 to the group controller 1212 and the module 1210 for collecting and storing raw and processed data. It is contemplated that the module 1204 may provide methods and means optimized for semiconductor processing to view and analyze the data in multiple formats and allow multivariate analysis. In one example, the sensor module 1204 may perform vibrational signature analysis and classification that can be accomplished in the time domain or the frequency domain (or both). Vibrational signature analysis in the time domain may include analysis of patterns, statistical analysis using standard deviation to characterize vibration signal levels, or wavelets for pattern matching. A time-domain vibration data collected from a sensor may be converted to the frequency domain using a Fourier Transform. Subsequently, the vibration data gathered may be compared to historical or baseline data gathered using the same set of sensors.

The GUI and algorithms module 1206 represents the user interfaces for the wireless system architecture. The GUI component can provide easy-to-use interfaces that enable users to view status, create and edit process control charts, view alarm data, configure data collection applications, configure data analysis applications, examine historical data and any new data, generate email-warnings, run multivariate models, and view diagnostics screens. The GUI and algorithms module 1206 can provide the functionality for interfacing to the sensor system 1202. Additionally the sequence of implementation includes events triggered by the sensor system 1202 and resulting data analysis. The raw data and/or processed data is then sent to the sensor data warehousing, mining, analysis module 1210. Data analysis allows for creating clustering sensor rules, which are stored in module 1208.

The clustering tools module 1208 contains rules and implementation details for clustering sensors. The choice of clustering can be based on data from the sensor systems 1202 and the sensor signal analysis module 1204, either manually or automatically. Further choice of clustering can be selected based on historical data from the module 1210 and/or from the WSNC server daemon 1220.

The group controller 1212 may be utilized to interface WSNC #1 to other wireless sensor networks (e.g., WSNC #2, ... WSNC #N) through the WSNC server daemon 1220, where the interfacing can, for example, use an intra-net. The WSNC server daemon 1220 can "listen" for requests from the customer 1250, process the requests, and forward requests for a sensor signal to one or more of the WSNC #1 1200, WSNC #2 1230, ... WSNC #N 1240. The WSNC server daemon 1220 can run continuously and is usually running in the background. As a sensor signal is received, the WSNC server daemon 1220 can be configured to determine what results are relayed to the customer 1250 for viewing. The customer view can be limited as defined by an application. The resulting configuration of the WSNC server daemon 1220 may include the sensor data warehousing module 1210, the clustering tools module 1208, and/or sensor system 1202. Furthermore, the resulting configuration may generate further action at any or all the modules 1202-1212 and the results propagated back to the WSNC server daemon 1220 which may reformat the information for presentation to the customer 1250. The information may be a combination of direct data and processed data for detecting and diagnosing drift and failures in the processing system and taking the appropriate correcting measures.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of monitoring a semiconductor processing system that comprises a processing chamber, an automatic pressure controller, a flow rate adjuster, a vacuum pump, a gas supply system, an exhaust system, and a plurality of gas lines, wherein the plurality of gas lines includes at least one gas feed line coupling the gas supply system to the processing chamber and at least one gas exhaust line coupling the processing chamber to the exhaust system, the method comprising:

positioning a plurality of non-invasive sensors on respective outer surfaces of at least one of the plurality of gas lines in the semiconductor processing system and on the respective outer surface of at least one of the automatic pressure controller, the flow rate adjuster, and the vacuum pump, wherein the plurality of non-invasive sensors form a wireless sensor network;

acquiring a sensor signal from the plurality of sensors in the wireless sensor network, wherein the sensor signal tracks a gradual or abrupt change in a processing state of at least one of the plurality of gas lines during a semiconductor manufacturing process comprising flow of a process gas in the processing system; and extracting the sensor signal from the wireless sensor network to store and process the sensor signal.

2. The method according to claim 1, wherein each of the plurality of non-invasive sensors is configured for sensing at least one of vibration, temperature, light emission, light absorption, pressure, humidity, electrical current, voltage, or tilt.

3. The method according to claim 1, wherein the wireless sensor network comprises motes.

4. The method according to claim 1, wherein the processing state comprises a real time condition of the at least one of the automatic pressure controller, the flow rate adjuster, and the vacuum pump relative to a baseline condition.

5. The method according to claim 1, wherein the processing state comprises an amount of a material deposit formed on an inner surface of the at least one of the automatic pressure controller, the flow rate adjuster, and the vacuum pump.

6. The method according to claim 1, wherein the processing state comprises conductance of the plurality of gas lines during the process relative to a baseline conductance.

7. The method according to claim 1, wherein at least one of the plurality of non-invasive sensors comprises an accelerometer sensor and the sensor signal comprises a vibrational signature, the vibrational signature comprises vibrations of the plurality of gas lines in response to the flow of the process gas in the processing system.

8. The method according to claim 7, wherein the vibrational signature further comprises vibrations of the automatic pressure controller during a pressure controlling step.

9. The method according to claim 8, wherein the pressure controlling step comprises a pressure increase step or a pressure reduction step.

10. The method according to claim 7, wherein the vibrational signature further comprises vibrations of the automatic pressure controller during a step of fully opening the automatic pressure controller from a closed position or a step of closing the automatic pressure controller from an open position.

11. The method according to claim 7, wherein a time length of the vibrational signature is proportional to an amount of a material deposit formed on an inner surface of the plurality of gas lines.

12. The method according to claim 1, further comprising:
correlating the processing state of the plurality of gas lines to a substrate processing condition during the process; and
continuing, discontinuing, or adjusting the process in response to the substrate processing condition.

13. The method according to claim 1, wherein the sensor signal identifies which of the plurality of non-invasive sensors in the wireless sensor network emitted the signal.

14. The method according to claim 1, wherein the sensor signal is at least partially processed by the wireless sensor network prior to the extraction.

15. The method according to claim 1, wherein the extracting comprises transferring the sensor signal to a system controller.

16. The method according to claim 1, wherein the semiconductor processing system comprises a thermal processing system, an etching system, a single wafer deposition system, a batch processing system, or a photoresist processing system.

17. The method according to claim 1, wherein at least one of the plurality of non-invasive sensors comprises a MEMS sensor integrated with a radio, a processor, and a memory.

18. A method of monitoring a semiconductor processing system that comprises a processing chamber, a gas supply system, an exhaust system, and a plurality of gas lines, wherein the plurality of gas lines includes at least one gas feed line coupling the gas supply system to the processing chamber and at least one gas exhaust line coupling the processing chamber to the exhaust system, the method comprising:
positioning a first plurality of accelerometer sensors on at least one of the plurality of gas lines and further positioning a second plurality of accelerometer sensors on an outer surface of a system component comprising an automatic pressure controller, a vacuum pump, or a flow rate adjuster, or combinations thereof in the processing system, wherein the first and second plurality of accelerometer sensors form a wireless sensor network;
acquiring a vibrational signal comprising a vibrational signature from the first and second plurality of accelerometer sensors in the wireless sensor network, the vibrational signature comprises vibrations of the at least one of the plurality of gas lines or the system component or a combination thereof in response to the flow of the process gas in the processing system, wherein the vibrational signal tracks a gradual or abrupt change in a processing state of any of the at least one of the plurality of gas lines and the system component during a process comprising flow of a process gas in contact with the at least one of the plurality of gas lines and the system component; and
extracting the vibrational signal from the wireless sensor network to store and process the vibrational signal.

19. The method according to claim 18, wherein the wireless sensor network comprises motes.

20. The method according to claim 18, wherein the processing state comprises a real time condition of the at least one of the plurality of gas lines and the system component relative to a baseline condition.

21. The method according to claim 18, wherein the processing state comprises an amount of a material deposit formed on an inner surface of the at least one of the plurality of gas lines and the system component.

22. The method according to claim 18, wherein the processing state comprises conductance of the at least one of the plurality of gas lines during the process relative to a baseline conductance.

23. The method according to claim 18, wherein the vibrational signature further comprises vibrations of the automatic pressure controller during a pressure controlling step.

24. The method according to claim 23, wherein the pressure controlling step comprises a pressure increase step or a pressure reduction step.

25. The method according to claim 18, wherein the vibrational signature further comprises vibrations of the automatic pressure controller during a step of fully opening the automatic pressure controller from a closed position or a step of closing the automatic pressure controller from an open position.

26. The method according to claim 18, wherein a time length of the vibrational signature is proportional to an amount of a material deposit formed on an inner surface of the at least one of the plurality of gas lines and the system component.

27. The method according to claim 18, further comprising:
correlating the processing state of the at least one of the plurality of gas lines and the system component to a substrate processing condition during the process; and
continuing, discontinuing, or adjusting the process in response to the substrate processing condition.

28. The method according to claim 18, wherein the vibrational signal identifies which of the first and second plurality of accelerometer sensors in the wireless sensor network generated the signal.

29. The method according to claim 18, wherein the vibrational signal is at least partially processed by the wireless sensor network prior to the extraction.

30. The method according to claim 18, wherein the extracting comprises transferring the vibrational signal to a system controller.

31. The method according to claim 18, wherein the semiconductor processing system comprises a thermal processing system, an etching system, a single wafer deposition system, a batch processing system, or a photoresist processing system.

32. The method according to claim 18, wherein at least one of the first and second plurality of accelerometer sensors comprises a MEMS sensor integrated with a radio, a processor, and memory.

33. The method according to claim 1, wherein the processing state comprises an amount of material deposit formed on an inner surface of at least one of the plurality of gas lines.

34. The method according to claim 1, wherein at least one of the plurality of non-invasive sensors comprises an accelerometer sensor and the sensor signal comprises a vibrational signature, the vibrational signature comprises vibrations of the at least one of the automatic pressure controller, the flow rate adjuster, and the vacuum pump in response to the flow of the process gas in the processing system.

35. A method of monitoring a semiconductor processing system that comprises a processing chamber, an automatic pressure controller, a flow rate adjuster, a vacuum pump, a gas supply system, an exhaust system, and a plurality of gas lines, wherein the plurality of gas lines includes at least one gas feed line coupling the gas supply system to the processing chamber and at least one gas exhaust line coupling the processing chamber to the exhaust system, the method comprising:
  positioning a plurality of non-invasive sensors on respective outer surfaces of at least one of the plurality of gas lines in the semiconductor processing system and on the respective outer surface of at least one of the automatic pressure controller, the flow rate adjuster, and the vacuum pump, wherein the plurality of non-invasive sensors form a wireless sensor network;
  acquiring at least two sensor signals in real time from the plurality of sensors in the wireless sensor network, wherein the at least two sensor signals track in real time a gradual or abrupt change in a processing state of at least one of the plurality of gas lines during a semiconductor manufacturing process comprising flow of a process gas in the semiconductor processing system; and
  extracting the at least two sensor signals from the wireless sensor network to store and process the at least two sensor signals.

* * * * *